(12) United States Patent
Miyakoshi et al.

(10) Patent No.: US 10,236,231 B2
(45) Date of Patent: Mar. 19, 2019

(54) SEMICONDUCTOR DEVICE

(71) Applicant: J-DEVICES CORPORATION, Usuki (JP)

(72) Inventors: Takeshi Miyakoshi, Yokohama (JP); Sumikazu Hosoyamada, Yokohama (JP); Yoshikazu Kumagaya, Yokohama (JP); Tomoshige Chikai, Yokohama (JP); Shingo Nakamura, Yokohama (JP); Hiroaki Matsubara, Yokohama (JP); Shotaro Sakumoto, Yokohama (JP)

(73) Assignee: J-DEVICES CORPORATION, Usuki (JP)

( * ) Notice: Subject to any disclaimer, the term of this patent is extended or adjusted under 35 U.S.C. 154(b) by 0 days.

(21) Appl. No.: 15/640,071

(22) Filed: Jun. 30, 2017

(65) Prior Publication Data

US 2017/0301599 A1   Oct. 19, 2017

Related U.S. Application Data

(62) Division of application No. 14/620,854, filed on Feb. 12, 2015.

(30) Foreign Application Priority Data

Feb. 26, 2014   (JP) ................................. 2014-035891

(51) Int. Cl.
*H01L 23/495*   (2006.01)
*H01L 23/00*   (2006.01)
(Continued)

(52) U.S. Cl.
CPC ...... *H01L 23/3135* (2013.01); *H01L 23/3107* (2013.01); *H01L 23/467* (2013.01);
(Continued)

(58) Field of Classification Search
CPC ....... H01L 21/56; H01L 21/563; H01L 23/12; H01L 23/49816; H01L 23/49822;
(Continued)

(56) References Cited

U.S. PATENT DOCUMENTS 5,249,101 A * 9/1993 Frey ................. H01L 21/563
174/545
5,390,082 A * 2/1995 Chase ............... H01L 21/563
174/521
(Continued)

FOREIGN PATENT DOCUMENTS

JP   60-178655   9/1985
JP   63-114152   5/1988
(Continued)

OTHER PUBLICATIONS

Notice of Reasons for Rejection for Japanese Patent Application No. 2014-035891 dated May 30, 2017.
(Continued)

*Primary Examiner* — Galina G Yushina

(57) ABSTRACT

A semiconductor device includes a lead frame; a circuit board located on the lead frame; a power device that includes a switching element and is mounted on the circuit board via a bump located between the power device and the circuit board; and a heat releasing member connected to the power device. The circuit board may be a multi-layer wiring board. The circuit board may include a capacitor element, a resistor element, an inductor element, a diode element and a switching element.

13 Claims, 25 Drawing Sheets

(51) Int. Cl.
  *H01L 23/31* (2006.01)
  *H01L 23/467* (2006.01)
  *H01L 23/473* (2006.01)
  *H01L 21/56* (2006.01)

(52) U.S. Cl.
  CPC ...... *H01L 23/473* (2013.01); *H01L 23/49524* (2013.01); *H01L 23/49531* (2013.01); *H01L 23/49562* (2013.01); *H01L 23/49568* (2013.01); *H01L 24/17* (2013.01); *H01L 24/36* (2013.01); *H01L 24/37* (2013.01); *H01L 24/40* (2013.01); *H01L 21/565* (2013.01); *H01L 23/49548* (2013.01); *H01L 2224/16245* (2013.01); *H01L 2224/37147* (2013.01); *H01L 2224/40095* (2013.01); *H01L 2224/40225* (2013.01); *H01L 2224/73204* (2013.01); *H01L 2224/83801* (2013.01); *H01L 2224/84801* (2013.01); *H01L 2924/1203* (2013.01); *H01L 2924/1205* (2013.01); *H01L 2924/1206* (2013.01); *H01L 2924/1207* (2013.01); *H01L 2924/1304* (2013.01); *H01L 2924/13055* (2013.01); *H01L 2924/13091* (2013.01); *H01L 2924/181* (2013.01)

(58) Field of Classification Search
  CPC ..... H01L 23/495; H01L 23/498; H01L 23/52; H01L 23/4012; H01L 25/043; H01L 2021/60022
  See application file for complete search history.

(56) References Cited

U.S. PATENT DOCUMENTS

| | | | | |
|---|---|---|---|---|
| 5,646,485 | A * | 7/1997 | Simon | B60Q 1/143 307/10.8 |
| 6,409,859 | B1 * | 6/2002 | Chung | B32B 7/12 156/250 |
| 2002/0079590 | A1 * | 6/2002 | Nakaoka | H01L 21/561 257/777 |
| 2002/0121684 | A1 | 9/2002 | Kobayakawa | |
| 2003/0042512 | A1 * | 3/2003 | Gonzalez | H01L 21/28185 257/263 |
| 2003/0052405 | A1 * | 3/2003 | Moriguchi | H01L 23/3107 257/706 |
| 2005/0116335 | A1 | 6/2005 | Karim | |
| 2005/0224945 | A1 * | 10/2005 | Saito | H01L 23/49575 257/686 |
| 2005/0242426 | A1 | 11/2005 | Kwon et al. | |
| 2007/0181997 | A1 | 8/2007 | Ahr et al. | |
| 2007/0285890 | A1 * | 12/2007 | Tsao | H01L 23/467 361/697 |
| 2009/0142940 | A1 | 6/2009 | Ikeda | |
| 2012/0038033 | A1 | 2/2012 | Oga et al. | |
| 2012/0244665 | A1 | 9/2012 | Sakai et al. | |
| 2014/0017523 | A1 | 5/2014 | Ho et al. | |
| 2014/0175454 | A1 * | 6/2014 | Roberts | H01L 25/18 257/76 |
| 2015/0200148 | A1 * | 7/2015 | Pon | H01L 21/4878 257/712 |

FOREIGN PATENT DOCUMENTS

| | | |
|---|---|---|
| JP | 6-97309 | 4/1994 |
| JP | 2001-68606 A | 3/2001 |
| JP | 2001-291823 A1 | 10/2001 |
| JP | 2002-190556 | 7/2002 |
| JP | 2002-222890 A | 8/2002 |
| JP | 2003-086737 A1 | 3/2003 |
| JP | 2004-014870 A1 | 1/2004 |
| JP | 2006-501675 | 1/2006 |
| JP | 2006-156479 | 6/2006 |
| JP | 2008-171963 A1 | 7/2008 |
| JP | 2009-117469 | 5/2009 |
| JP | 2009-302526 A1 | 12/2009 |
| WO | WO2004/032232 A1 | 4/2004 |
| WO | WO2012/011210 A1 | 1/2012 |

OTHER PUBLICATIONS

Restriction Requirement for co-pending U.S. Appl. No. 14/620,854 dated Aug. 17, 2015.
Office Action for co-pending U.S. Appl. No. 14/620,854 dated Nov. 27, 2015.
Final Office Action for co-pending U.S. Appl. No. 14/620,854 dated May 4, 2016.
Office Action for co-pending U.S. Appl. No. 14/620,854 dated Sep. 28, 2016.
Final Office Action for co-pending U.S. Appl. No. 14/620,854 dated Mar. 2, 2017.
Advisory Action for co-pending U.S. Appl. No. 14/620,854 dated Jun. 8, 2017.
U.S. Appl. No. 14/620,854, filed Feb. 12, 2015, Takeshi Miyakoshi, J-Devices Corporation.
Office Action dated Jan. 9, 2018, in corresponding Japanese Patent Application No. 2014-035891, 8 pgs.
Notice of Allowance dated Aug. 7, 2018 in corresponding Japanese Patent Application No. 2014-035891, 5 pgs.

* cited by examiner

SEMICONDUCTOR DEVICE

CROSS-REFERENCE TO RELATED APPLICATIONS

This application is a divisional application that claims priority on U.S. application Ser. No. 14/620,854, filed Feb. 12, 2015, which is based upon and claims the benefit of foreign priority from the prior Japanese Patent Application No. 2014-035891, filed on Feb. 26, 2014, both applications are incorporated by reference in their entirety.

FIELD

The present invention relates to a technology for mounting a semiconductor device, and specifically to a heat releasing mechanism that releases heat generated in a power device in the semiconductor device.

BACKGROUND

Recently, in order to realize higher performance of automobiles, a power device is used as one of semiconductor devices that support electronics for automobiles. A power device controls electric power for electronics for automobiles, and is used in various components including, for example, hydraulic valve controllers of ABS's (Antilock Brake Systems) or the like, motor controllers of power windows or the like, inverters that convert DC voltages of batteries or driving motors into DC voltages, and the like.

Current main-stream power devices use silicon (Si) semiconductors. Along with the development of hybrid vehicles and electric vehicles, next-generation power devices which consume less power and are operable under high-temperature and high-voltage conditions are now desired. Such new-generation power devices use, for example, silicon carbide (SiC), gallium nitride (GaN) or the like as described in, for example, Japanese Patent Application No. 2004-340918. These next-generation power devices have an operating frequency at the time of switching that is higher than that of conventional power devices. Therefore, when such a next-generation power device is mounted by a conventional method of wire bonding, there occurs a problem that electric noise is caused by an inductance component in the wire bonding part. In a worst case, the electric noise destroys the power device itself.

A power device, especially, a power device for electronics for automobiles is often used in an engine room, which may have a very high temperature in certain environments of use. In addition, the power device generates heat itself when being driven and thus has a very high temperature. As a result, the temperature of the power device may possibly be raised to 200° C. to 250° C. Such a high temperature of the power device influences the switching characteristics thereof, and also deforms a resin material that is used to form the power device. For these reasons, the next-generation power device is desired to have a high heat releasing characteristic. In addition, the power device is used in a limited space such as an engine room or the like, and therefore is required to be reduced in size.

SUMMARY

A semiconductor device in an embodiment according to the present invention includes a lead frame; a circuit board located on the lead frame; a power device including a switching element, the power device being mounted on the circuit board via a bump located between the power device and the circuit board; and a heat releasing member connected to the power device.

The circuit board may be a multi-layer wiring board.

The circuit board may include a capacitor element, a resistor element, an inductor element, a diode element and a switching element.

The circuit board may include a circuit outputting an output signal in response to an input signal, the output signal being different from the input signal.

The heat releasing member may be connected to the lead frame.

The semiconductor device may further include a sealing resin covering the lead frame, the circuit board, the power device and the heat releasing member.

The semiconductor device may further include a sealing resin covering the lead frame, the circuit board, the power device and the heat releasing member so as to expose a part of the heat releasing member. A surface of the exposed part of the heat releasing member may be flush with a surface of the sealing resin.

The semiconductor device may further include a sealing resin covering the lead frame, the circuit board, the power device and the heat releasing member so as to expose a part of the heat releasing member. A top surface and a side surface of the part of the heat releasing member may be exposed.

The surface of the exposed part of the heat releasing member may have a convexed and concaved shape.

The exposed part of the heat releasing member may include a flow path formed therein.

The sealing resin may include a first resin and a second resin; the first resin may be located between the circuit board and the power device; and the second resin may be located so as to cover the first resin.

The first resin may have a coefficient of thermal expansion closer to the coefficient of thermal expansion of the bump than the coefficient of thermal expansion of the second resin.

The first resin may have a heat conductivity higher than the heat conductivity of the second resin.

The heat releasing member may extend in a plurality of different directions from the power device, and parts of the heat releasing member extending in the plurality of different directions may be connected to the lead frame.

The heat releasing member may cover at least circuits provided on the circuit board.

The present invention provides a semiconductor device including a high-output power device that has a high heat releasing characteristic.

DESCRIPTION OF EMBODIMENTS

Figure 1:
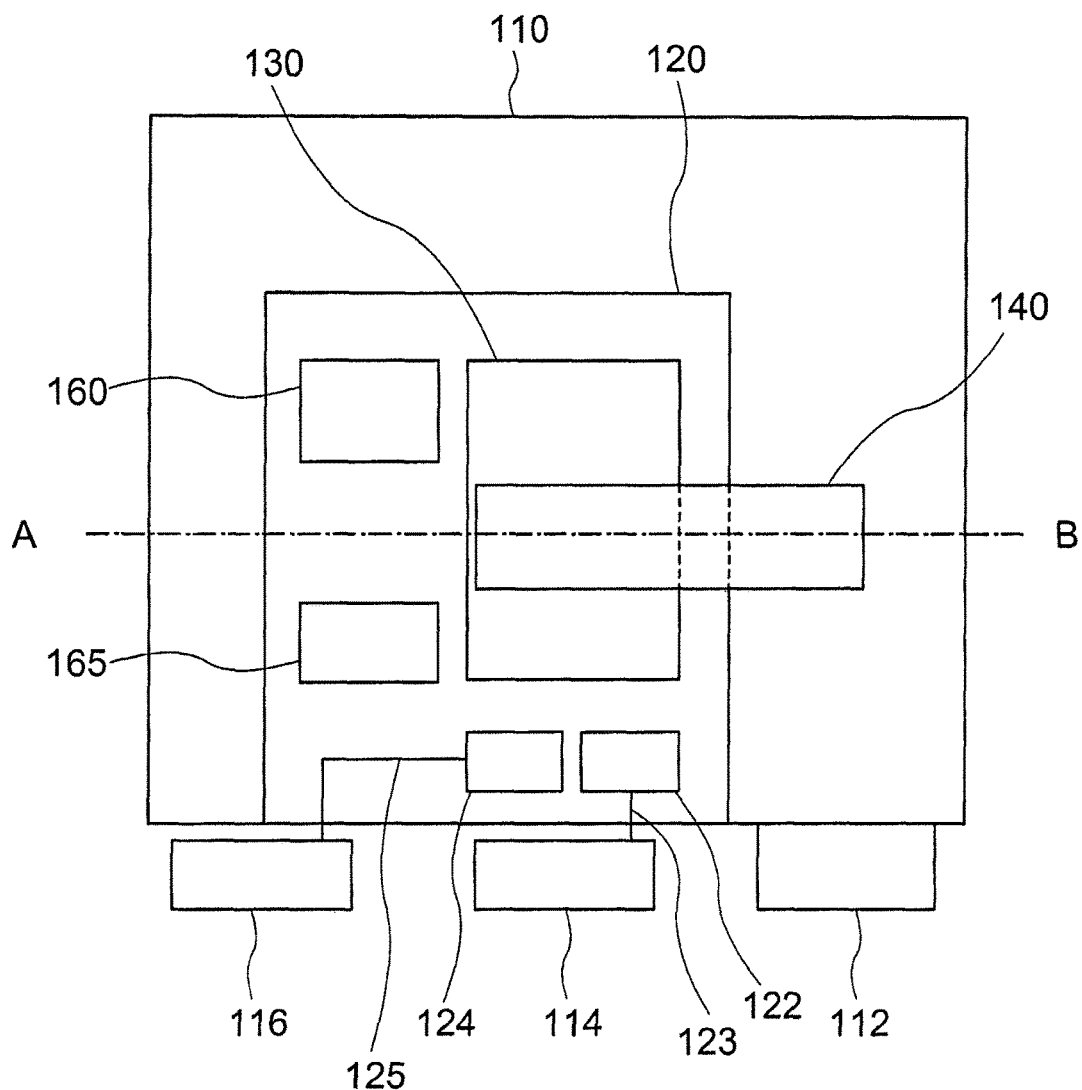
FIG. 1 is a schematic plan view of a semiconductor device in Embodiment 1 according to the present invention.

Hereinafter, a semiconductor device according to the present invention will be described with reference to the drawings. It should be noted that the semiconductor device according to the present invention may be carried out in many different embodiments, and should not be construed as being limited to the following embodiments. In the drawings referred to in the following embodiments, the same components or components having substantially the same functions will bear the same reference signs, and descriptions thereof will not be repeated.

Embodiment 1

Figure 2:
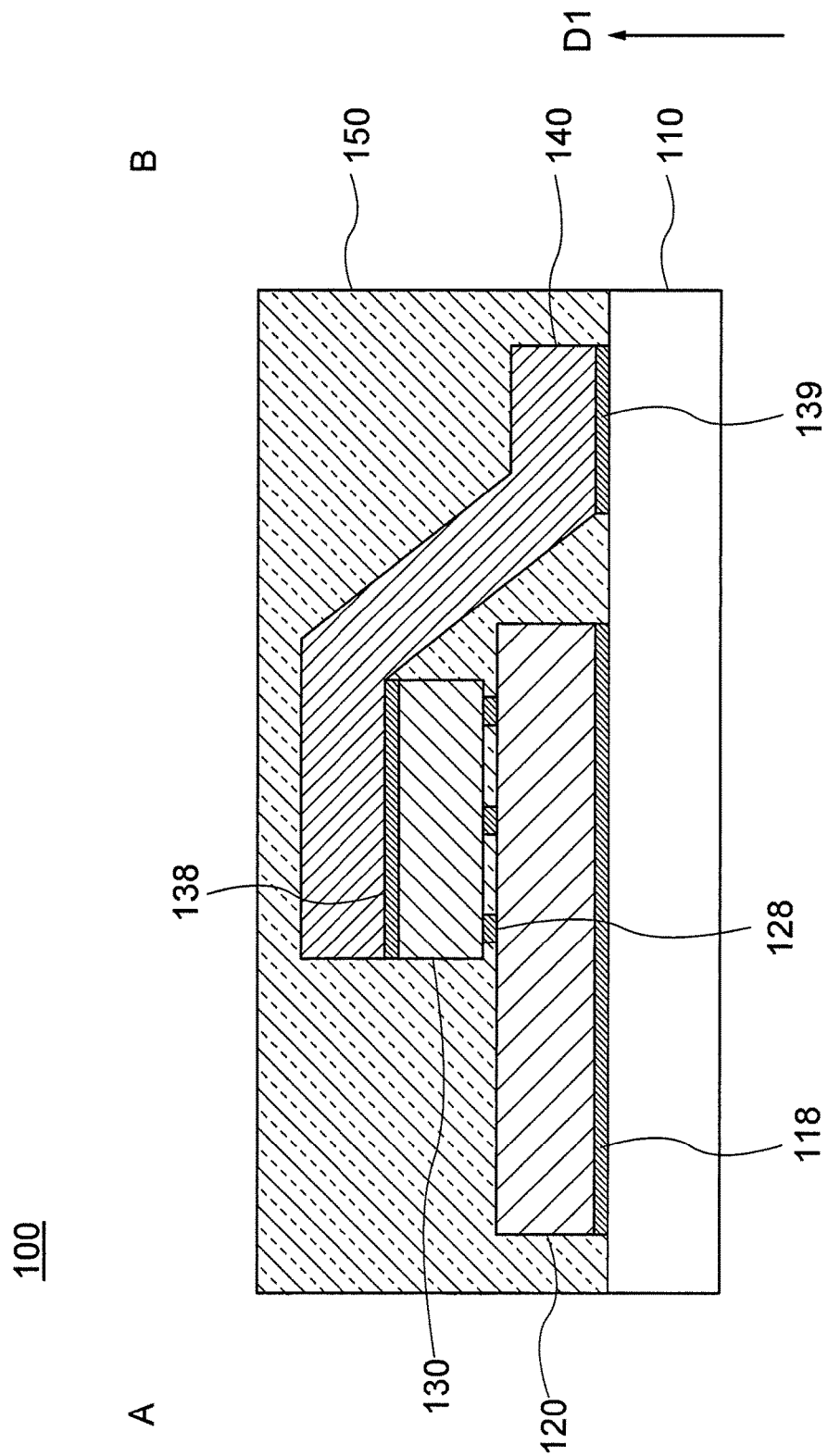
FIG. 2 is a cross-sectional view of the semiconductor device in Embodiment 1 according to the present invention, taken along line A-B in FIG. 1.

A semiconductor device 100 in Embodiment 1 according to the present invention will be described in detail with reference to FIG. 1 and FIG. 2. FIG. 1 is a schematic plan view of the semiconductor device 100 in Embodiment 1 according to the present invention. FIG. 2 is a cross-sectional view of the semiconductor device 100 in Embodiment 1 according to the present invention, taken along line A-B in FIG. 1.

As shown in FIG. 1, the semiconductor device 100 in Embodiment 1 includes a lead frame 110, a circuit board 120 located on the lead frame 110, a power device 130 that includes a switching element and is mounted on the circuit board 120 via a bump located between the power device 130 and the circuit board 120, a heat releasing member 140 that is formed of a metal material and is connected to the power device 130, an integrated passive device (IPD) 160 and a peripheral integrated circuit (IC) 165.

The power device 130 includes a three-terminal field effect transistor (FET) as the switching element. The three terminals of the field effect transistor are respectively referred to as a source terminal, a drain terminal and a gate terminal. The FET operates as follows. In a state where a voltage is applied between a source electrode connected to the source terminal and a drain electrode connected to the drain terminal, a voltage is applied to a gate electrode connected to the gate terminal. When this occurs, a channel is formed between the source electrode and the drain electrode, and an electric current flows. The source terminal of the FET is connected to an external source terminal 112 via a wire of the circuit board 120 and also via the lead frame 110. The drain terminal of the FET is connected to a drain terminal pad 122 that is located on the circuit board 120 via a wire of the circuit board 120. The drain terminal pad 122 is connected to an external drain terminal 114 via a wire 123. The gate terminal of the FET is connected to a gate terminal pad 124 located on the circuit board 120 via a wire of the circuit board 120. The gate terminal pad 124 is connected to an external gate terminal 116 via a wire 125.

The lead frame 110 may be formed of a material having a high electric conductivity and a high heat release characteristic. The lead frame 110 may be formed of, for example, a Cu material (C1020) or the like.

The circuit board 120 includes a circuit that transmits voltages supplied from at least the external source terminal 112, the external drain terminal 114 and the external gate terminal 116 to the source terminal, the drain terminal and the gate terminal of the FET of the power device 130. The circuit board 120 may be a multi-layer wiring board. The circuit board 120 may be an organic printed wiring board (PWB), a ceramic direct copper bond (DCB) board, a metal base wiring board using copper (Cu), aluminum (Al) or the like, a components-embedded board having a chip capacitor, a chip resistor and the like embedded therein, or the like. The circuit board 120 may merely include wires, or may be a functional circuit board that includes a capacitor element, a resistor element, an inductor element, a diode element and a switching element and outputs an output signal different from an input signal when receiving the input signal.

The power device 130 is a semiconductor device capable of controlling high power of several hundred volts to several thousand volts. The power device 130 may be a semiconductor device having switching characteristics that are not easily changed in accordance with the temperature. For a power device mounted on an automobile, a household electric/electronic appliance or the like, a switching element using, for example, a silicon (Si) substrate, a silicon carbide (SiC) substrate, a gallium nitride (GaN) substrate or the like is usable. The switching element may be a MOSFET (Metal Oxide Semiconductor FET), an IGBT (Insulated Gate Bipolar Transistor), a triac, a thyristor, a diode, an HEMT (High Electron Mobility Transistor) or the like.

The heat releasing member 140 may be formed of a metal material having a high heat conductivity and may be, for example, a copper plate. A heat releasing member formed of a copper plate may be referred to as a "metal clip" or a "copper clip". Alternatively, the heat releasing member 140 may be a graphite sheet formed of graphite, which has a higher electric conductivity than that of copper. "Graphite" is a crystal in which carbon atoms arrayed in a hexagonal shape to have a mesh planar structure are stacked in layers. A "graphite sheet" is obtained by processing the graphite into a sheet. A graphite sheet has a planar-direction heat conductivity that is about four times that of copper, and provides high performance as a heat releasing member.

The IPD 160 is a circuit board in which a capacitor element, a resistor element, an inductor element, a diode element and a switching element are integrated together. The IPD 160 may include an antenna for wireless communication with an external wireless device. The IPD 160 may be located on the circuit board 120 as a separate component as shown in FIG. 1 or may be embedded in a components-embedded board as described above. The peripheral IC 165 is an LSI that controls the power device 130, and controls the switching element included in the power device 130 to be on or off.

As shown in FIG. 2, the lead frame 110 and the circuit board 120 are connected to each other via an electrically conductive adhesive member 118. The circuit board 120 and the power device 130 are connected to each other via conductive bumps 128. The power device 130 is bonded by a so-called flip-chip method, by which the power device 130 in a face-down state is connected to the circuit board 120. The power device 130 and the heat releasing member 140 are connected to each other via a highly heat conductive adhesive member 138, and the lead frame 110 and the heat releasing member 140 are connected to each other via a highly heat conductive adhesive member 139. In this embodiment, the lead frame 110, the circuit board 120, the power device 130 and the heat releasing member 140 are connected via the adhesive members or the bumps as described above. Alternatively, these components may be connected directly. For example, the lead frame 110 and the heat releasing member 140 may be connected to each other directly.

The electrically conductive adhesive member 118 may be formed of solder, sintered silver (Ag) or the like. The bumps 128 may be formed of copper, silver, gold, solder or the like. The highly heat conductive adhesive members 138 and 139 may each be formed of an electrically conductive adhesive material or an insulating adhesive material. The electrically conductive adhesive material may be solder or the like. The insulating adhesive material may be, for example, an organic adhesive material containing an insulating ceramic filler, for example, alumina or the like. The highly heat conductive adhesive members 138 and 139 need to have a high heat conductivity, but may or may not need to have an electric conductivity depending on the type of the switching element of the power device 130. As described in detail later, in the case where, for example, a vertical transistor is used as the switching element, namely, in the case where the power device 130 needs to be conductive on a rear surface thereof (surface directed in the direction of D1 in FIG. 2), the highly heat conductive adhesive members 138 and 139 need to be formed of an electrically conductive material such as solder or the like.

A sealing resin 150 is provided so as to cover the lead frame 110, the circuit board 120, the power device 130 and the heat releasing member 140. The sealing resin 150 secures the above-listed components, prevents the above-listed components from being contaminated with moisture or impurities from outside, and alleviates impact from outside to protect the above-listed components. The sealing resin 150 may be formed of an epoxy resin, a cyanate ester resin, an acrylic resin, a polyimide resin, a silicone resin or the like.

Figure 3:
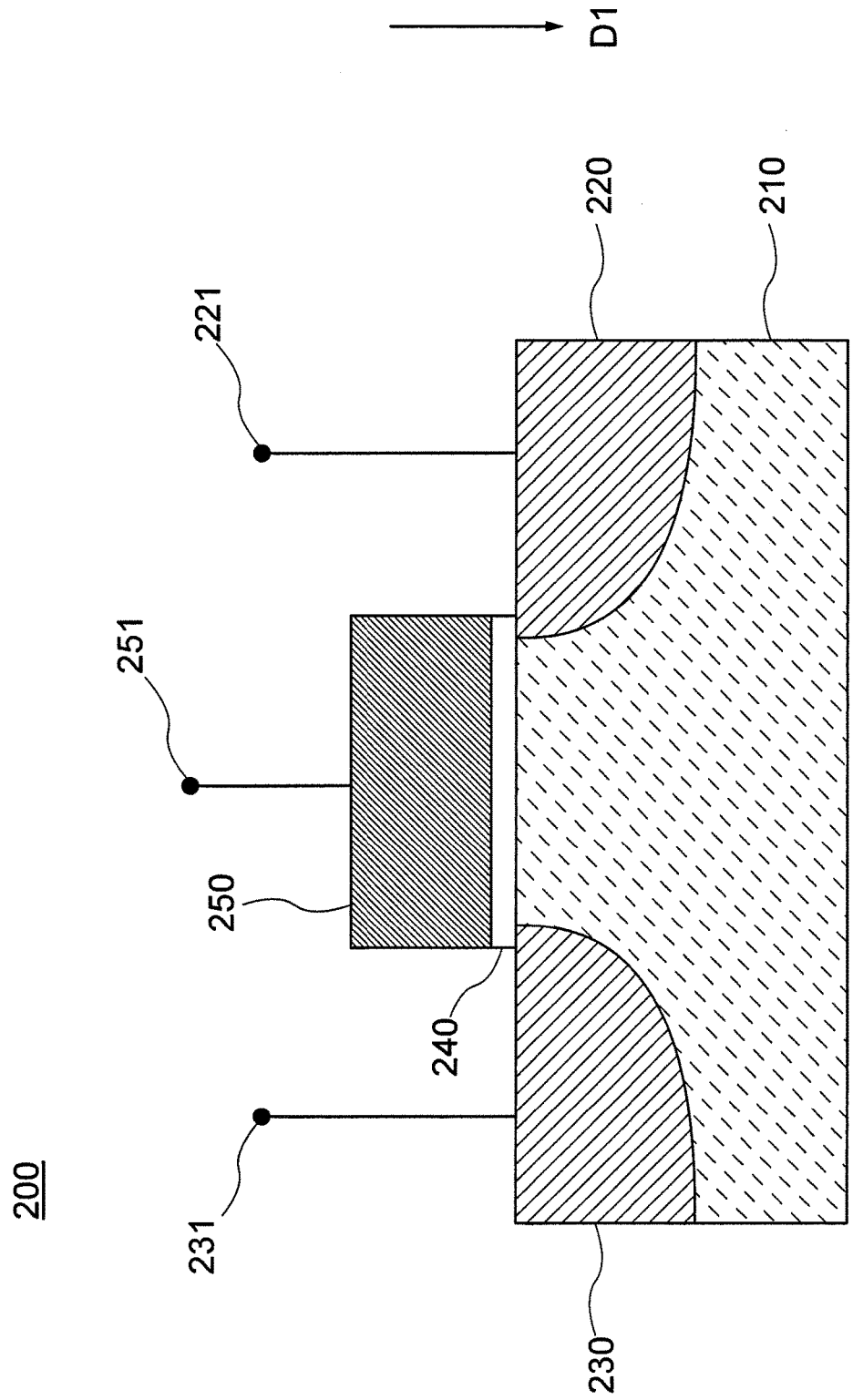
FIG. 3 is a cross-sectional view of an example of horizontal switching element that may be included in a power device in the semiconductor device in Embodiment 1 according to the present invention.
Figure 4:
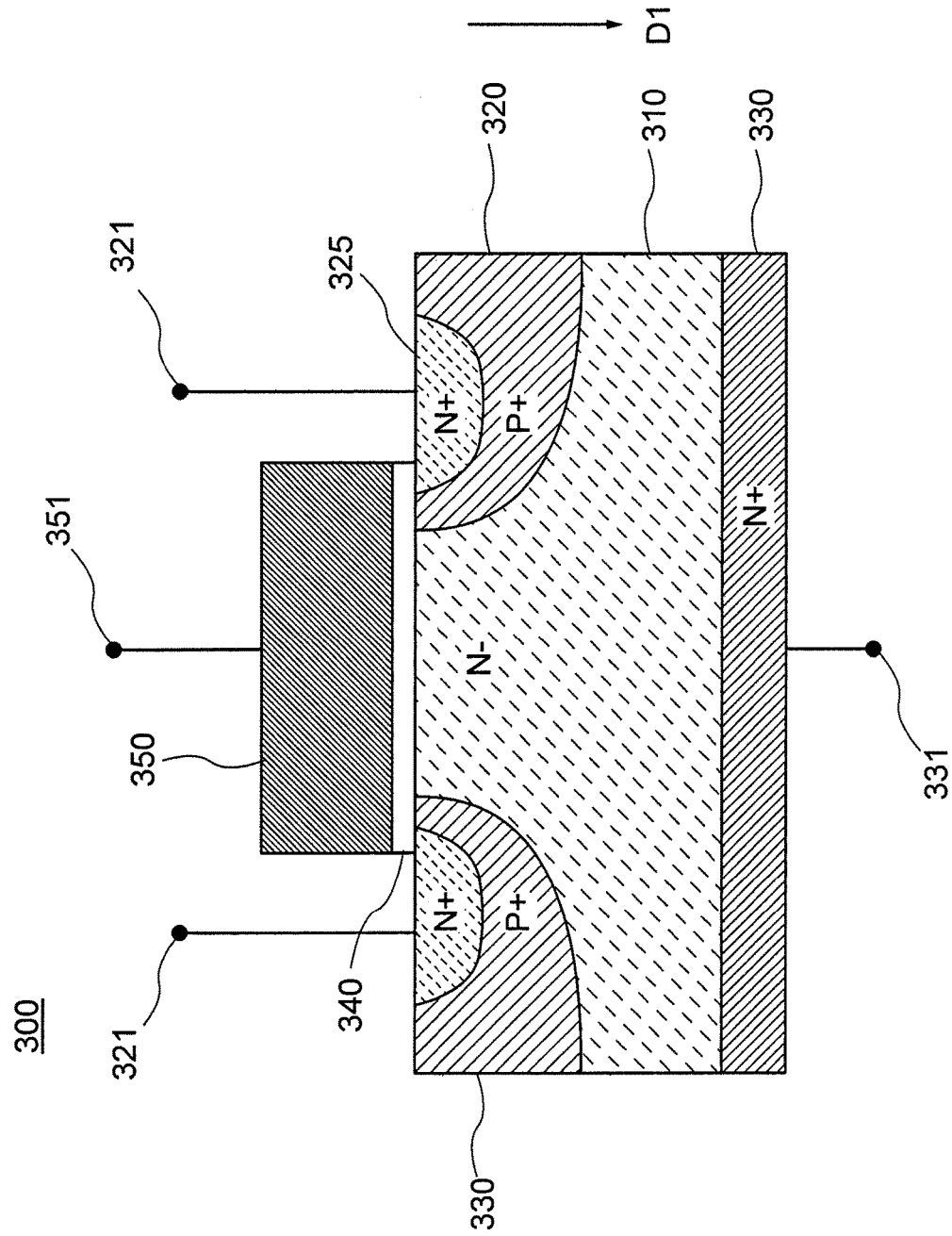
FIG. 4 is a cross-sectional view of an example of vertical switching element that may be included in the power device in the semiconductor device in Embodiment 1 according to the present invention.

Now, the switching element of the power device 130 will be described with reference to FIG. 3 and FIG. 4. FIG. 3 is a cross-sectional view of an example of horizontal switching element 200 that may be included in the power device 130 in the semiconductor device 100 in Embodiment 1 according to the present invention. FIG. 4 is a cross-sectional view of an example of vertical switching element 300 that may be included in the power device 130 in the semiconductor device 100 in Embodiment 1 according to the present invention.

The horizontal switching element 200 shown in FIG. 3 is also referred to as a "planar-type transistor" and may be, for example, an Si-substrate MOSFET, a GaN-substrate MOSFET, a GaN-substrate HEMT or the like. A structure of the horizontal switching element 200 will be briefly described with reference to FIG. 3. The horizontal switching element 200 includes a semiconductor substrate 210, a source electrode 220, a drain electrode 230, a gate insulating film 240 and a gate electrode 250. The semiconductor substrate 210 and the gate electrode 250 are insulated from each other by the gate insulating film 240.

The horizontal switching element 200 operates as follows. A voltage is applied to the gate electrode 250. An electric field generated by the voltage application allows electrons to be gathered to an area of the semiconductor substrate 210 that is close to the gate insulating film 240. As a result, a channel is formed to turn on the switching element 200. When a voltage is applied between the source electrode 220 and the drain electrode 230 in this state, an electric field generated by the voltage application allows the electrons to be transferred horizontally. As a result, an electric current flows. As can be seen, in the horizontal switching element 200, the source electrode 220, the drain electrode 230 and the gate electrode 250 are respectively connected to a source terminal 221, a drain terminal 231 and a gate terminal 251 at a surface directed oppositely to the direction of D1 (at a top surface of each electrode). Namely, the three terminals used to drive the transistor are all located on the side of a top surface of the power device 130.

The vertical switching element 300 shown in FIG. 4 may be, for example, an SiC-substrate MOSFET or the like. A structure of the vertical switching element 300 will be briefly described with reference to FIG. 4. The vertical switching element 300 includes an N-type epitaxial growth layer 310, a P-type implanted layer 320, an N-type implanted layer (also referred to as a "source electrode") 325, an N-type SiC substrate (also referred to as a "drain electrode") 330, a gate insulating layer 340 and a gate electrode 350. The N-type epitaxial growth layer 310 and the gate electrode 350 are insulated from each other by the gate insulating film 340. At an interface between the N-type implanted layer 325 and the P-type implanted layer 320, a p-n junction is formed.

In the vertical switching element 300, the p-n junction is formed at the interface between the N-type implanted layer 325 and the P-type implanted layer 320. Therefore, in a state where no voltage is applied to the gate electrode 350, no electric current flows from the N-type implanted layer 325 to the P-type implanted layer 320. By contrast, in a state where a voltage is applied to the gate electrode 350, the energy barrier of the p-n junction is lowered to provide a state where an electric current flows from the N-type implanted layer 325 to the P-type implanted layer 320 (a state where the switching element 300 is on). When a voltage is applied between the N-type implanted layer 325 and the N-type SiC substrate 330 in this state, an electric field generated by the voltage application allows electrons to be transferred vertically. As a result, an electric current flows. As can be seen, in the vertical switching element 300, the source electrode 325 and the gate electrode 350 are respectively connected to a source terminal 321 and a gate terminal 351 at a surface directed oppositely to the direction of D1 (at a top surface of each electrode). The drain electrode 330 is connected to a drain terminal 331 at a surface directed in the direction of D1 (at a rear surface thereof). Namely, the three terminals used to drive the transistor are located on the side of a top surface and a rear surface of the power device 130.

As described above, in the semiconductor device 100 in Embodiment 1, the rear surface of the power device 130 and the lead frame 110 are connected to each other via the heat releasing member 140. Therefore, heat generated by the driving of the switching element included in the power device 130 is transmitted to the lead frame 110 efficiently via the heat releasing member 140. Thus, a high heat releasing characteristic is provided by the power device 130, which has a high output. In addition, the power device 130 is connected to the circuit board 120 via the bumps 128 by the flip-chip method. Therefore, the inductor component in the connection part is smaller than in the case where the power device 130 is connected to the circuit board 120 by a wire bonding method. This suppresses electric noise from being caused in the connection part. Since the power device 130 is mounted on the lead frame 110 via the circuit board 120, components having functions required for the semiconductor device 100 are allowed to be stacked. Therefore, the semiconductor device 100 is reduced in size.

(Modification of Embodiment 1)

With reference to FIG. 5 through FIG. 10, a semiconductor device 100 in a modification of Embodiment 1 according to the present invention will be described in detail. First, with reference to FIG. 5, a structure of the semiconductor device 100 in the modification of Embodiment 1 will be described. Then, with reference to FIG. 6 through FIG. 10, a method for producing the semiconductor device 100 in the modification of Embodiment 1 will be described. A plan view of the semiconductor device 100 in the modification of Embodiment 1 is substantially the same as that in FIG. 1, and thus FIG. 1 is used as a plan view of the semiconductor device 100 in the modification of Embodiment 1.

Figure 5:
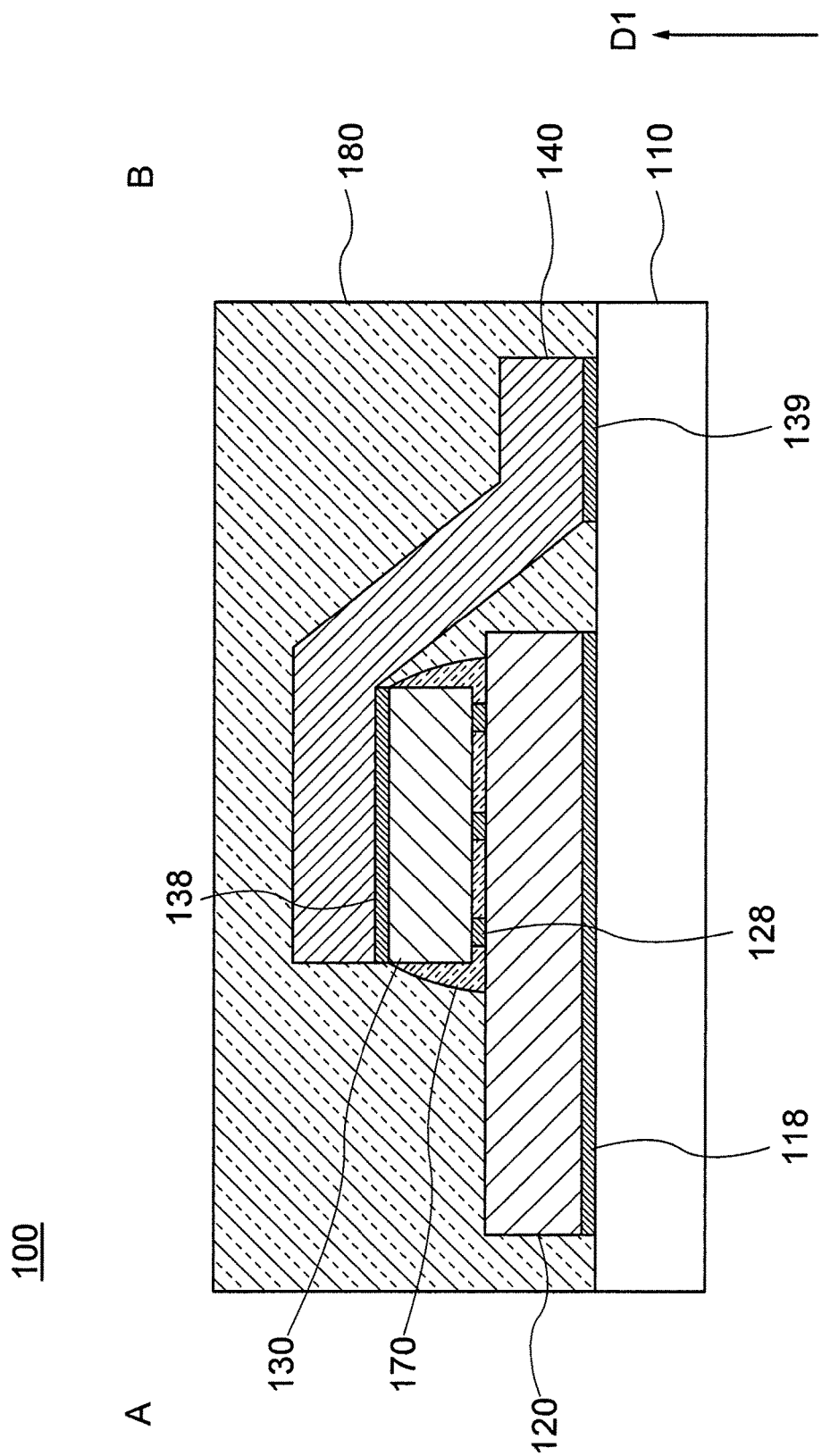
FIG. 5 is a cross-sectional view of a semiconductor device in a modification of Embodiment 1 according to the present invention, taken along line A-B in FIG. 1.

FIG. 5 is a cross-sectional view of the semiconductor device 100 in Embodiment 1 according to the present invention, taken along line A-B in FIG. 1. FIG. 5 is similar to FIG. 2, but is different from FIG. 2 in the following point. In FIG. 5, the semiconductor device 100 includes a first resin 170 provided between the circuit board 120 and the power device 130, and a second resin 180 located so as to cover the first resin 170. The first resin 170 is provided to secure the circuit board 120 and the power device 130 to each other, and is also referred to as an "under-fill resin". The second resin 180 is formed of the same material as that of the sealing resin 150 shown in FIG. 2.

The first resin 170 may have a coefficient of thermal expansion that is closer to that of the bumps 128 than that of the second resin 180. The first resin 170 may have a heat conductivity that is higher than that of the second resin 180. The first resin 170 may be formed of an epoxy resin, a cyanate ester resin, an acrylic resin, a polyimide resin, a silicone resin or the like, like the sealing resin 150 shown in FIG. 2. Alternatively, the first resin 170 may be formed of a resin material that contains impurities and thus is adjusted to have the above-described coefficient of thermal expansion or heat conductivity. The first resin 170 may be formed of, for example, an epoxy resin containing silica filler.

As described above, in the semiconductor device 100 in the modification of Embodiment 1, the first resin 170 is provided between the circuit board 120 and the power device 130, which are connected to each other via the bumps 128. This further improves the connection strength between the circuit board 120 and the power device 130. Therefore, the mechanical strength of the semiconductor device 100 is increased. If, for example, in the structure shown in FIG. 2, the difference between the coefficient of thermal expansion of the bumps 128 and that of the sealing resin 150 is large, the bumps 128 may possibly be peeled off from the circuit board 120 or the power device 130 by a stress caused by thermal expansion and contraction, and as a result, the electric connection between the circuit board 120 and the power device 130 may possibly be broken.

However, in the modification of Embodiment 1, the coefficient of thermal expansion of the first resin 170 is closer to that of the bumps 128 than that of the second resin 180. This alleviates the stress caused to the bumps 128 by the thermal expansion and contraction. Therefore, the bumps 128 are suppressed from being peeled off from the circuit board 120 or the power device 130. In addition, the heat conductivity of the first resin 170 is higher than that of the second resin 180. This allows the heat generated in the power device 130 to be transmitted easily to the lead frame 110 via the circuit board 120. Therefore, a high heat releasing characteristic is provided by the power device 130, which has a high output.

Figure 6:
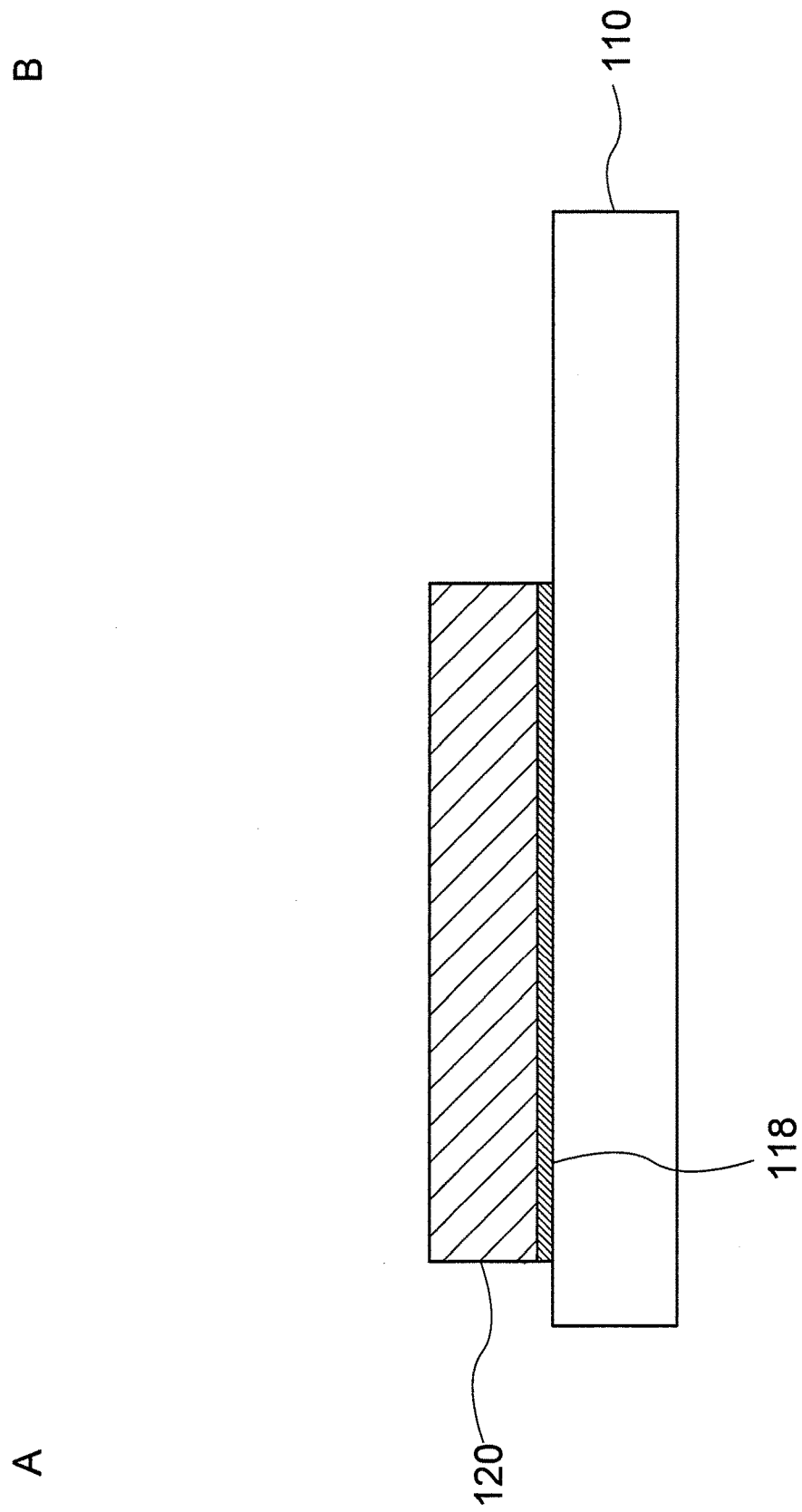
FIG. 6 is a cross-sectional view showing a step in a method for producing the semiconductor device in the modification of Embodiment 1 according to the present invention, specifically, a step of mounting a circuit board on a lead frame.

Now, a method for producing the semiconductor device 100 shown in FIG. 5 will be described with reference to cross-sectional views. FIG. 6 is a cross-sectional view showing a step in the method for producing the semiconductor device 100 in the modification of Embodiment 1 according to the present invention, specifically, a step of mounting the circuit board 120 on the lead frame 110. First, melted solder is dripped onto the lead frame 110, and the circuit board 120 is attached to the lead frame 110 before the solder is solidified. The circuit board 120 is attached to the lead frame 110 while being aligned such that an external terminal of the circuit board 120 contacts the solder. According to an alternative method that does not use the solder, a solvent containing nano-sized silver particles dispersed therein is applied to the lead frame 110, the circuit board 120 is attached to the lead frame 110, and the assembly of the lead frame 110 and the circuit board 120 is heat-treated to be solidified (sintered).

Figure 7:
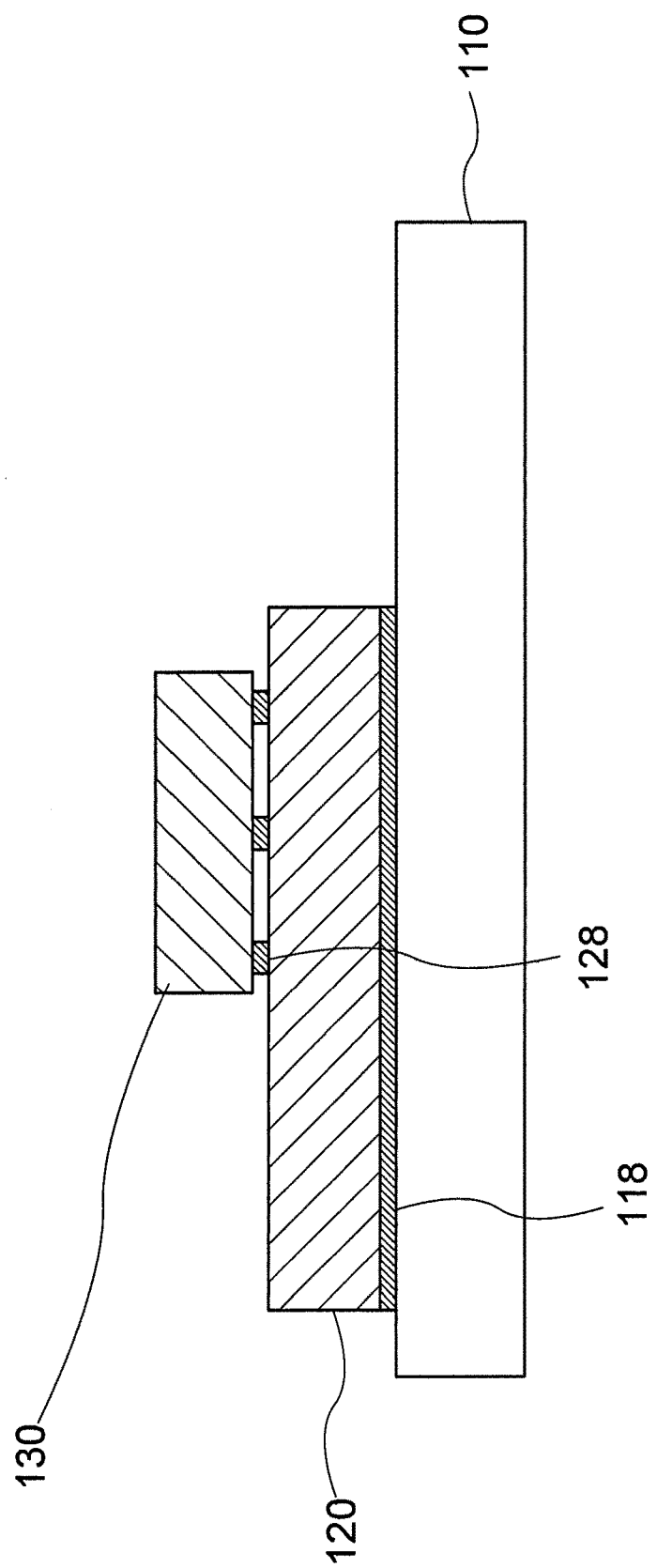
FIG. 7 is a cross-sectional view showing a step in the method for producing the semiconductor device in the modification of Embodiment 1 according to the present invention, specifically, a step of mounting a power device on the circuit board by a flip-chip method.

FIG. 7 is a cross-sectional view showing a step in the method for producing the semiconductor device 100 in the modification of Embodiment 1 according to the present invention, specifically, a step of mounting the power device 130 on the circuit board 120 by the flip-chip method. In the step shown in FIG. 7, the bumps 128 are formed on the power device 130 in correspondence with an input part (not shown) located on the top surface of the power device 130, and the power device 130 is attached to the circuit board 120 in a face-down state, namely, in a state where the top surface of the power device 130 faces a surface of the circuit board 120. The power device 130 is attached to the circuit board 120 while being aligned such that an output part of the circuit board 120 contacts the bumps 128. According to an alternative method, the bumps 128 are formed on the surface of the circuit board 120, and then the power device 130 is attached to the circuit board 120.

Figure 8:
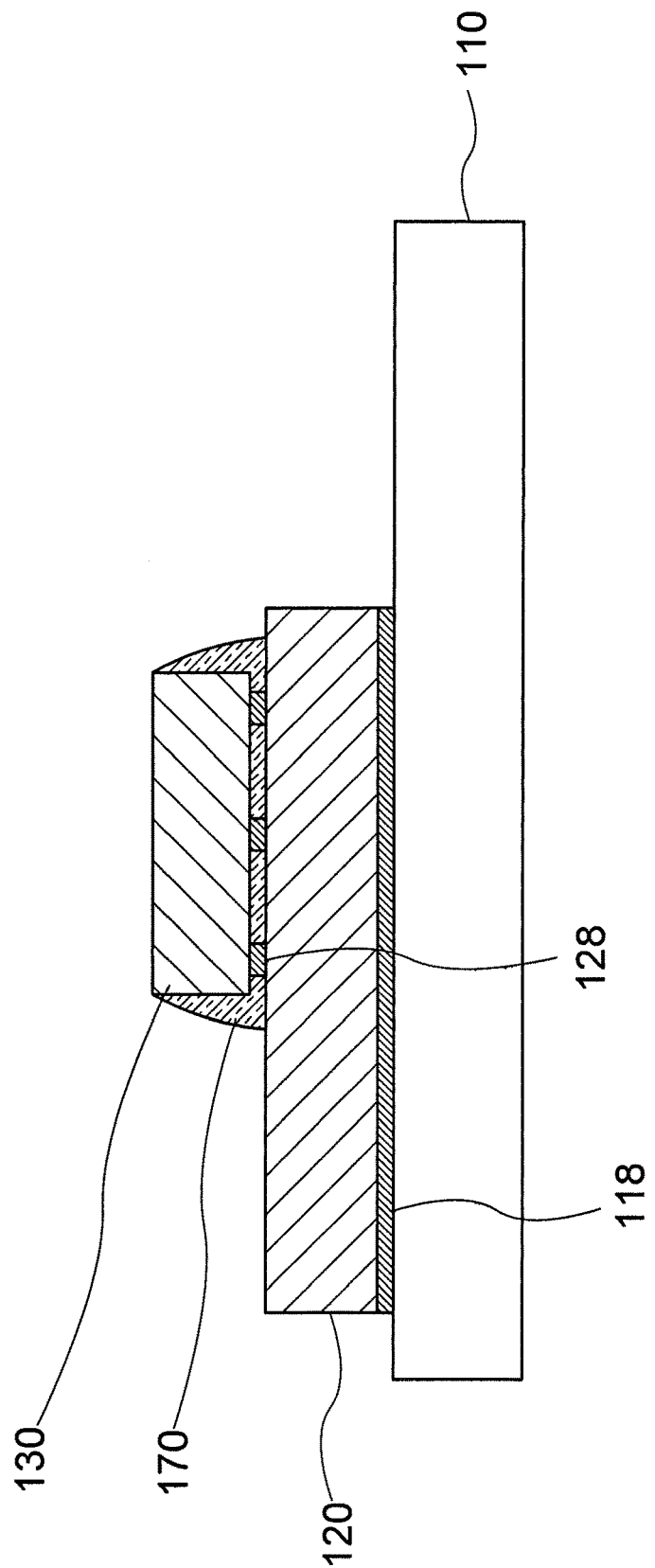
FIG. 8 is a cross-sectional view showing a step in the method for producing the semiconductor device in the modification of Embodiment 1 according to the present invention, specifically, a step of forming an under-fill resin between the circuit board and the power device.

FIG. 8 is a cross-sectional view showing a step in the method for producing the semiconductor device 100 in the modification of Embodiment 1 according to the present invention, specifically, a step of forming the under-fill resin 170 between the circuit board 120 and the power device 130. In the step shown in FIG. 8, the first resin 170 is formed as the under-fill resin between the circuit board 120 and the power device 130, which are connected to each other via the bumps 128. The first resin 170 may be injected in one direction so that no gap is formed between the circuit board 120 and the power device 130. This will be described more specifically. In a state where the lead frame 110 having the circuit board 120 and the power device 130 mounted thereon as shown in FIG. 7 is heated, the first resin 170 is dripped onto an area of the circuit board 120 that is close to an end of the power device 130. The dripped first resin 170 spreads between the circuit board 120 and the power device 130 because of a capillary action. Since the surface of the circuit board 120 is heated, the viscosity of the first resin 170 is decreased. Thus, the first resin 170 spreads between the circuit board 120 and the power device 130 more smoothly than in the case where the surface of the circuit board 120 is not heated.

In the process described above with reference to FIG. 7 and FIG. 8, the power device 130 is mounted on the circuit board 120 via the bumps 128, and then the first resin 170 is formed. The present invention is not limited to this process. According to an alternative method, the first resin 170 is applied to the circuit board 120, and then the power device 130 having the bumps 128 formed thereon is mounted on the circuit board 120 by a thermal press bonding method. According to another alternative method, the bumps 128 are formed on the circuit board 120, then the first resin 170 is applied thereto, and the power device 130 is mounted on the circuit board 120 by the thermal press bonding method.

Figure 9:
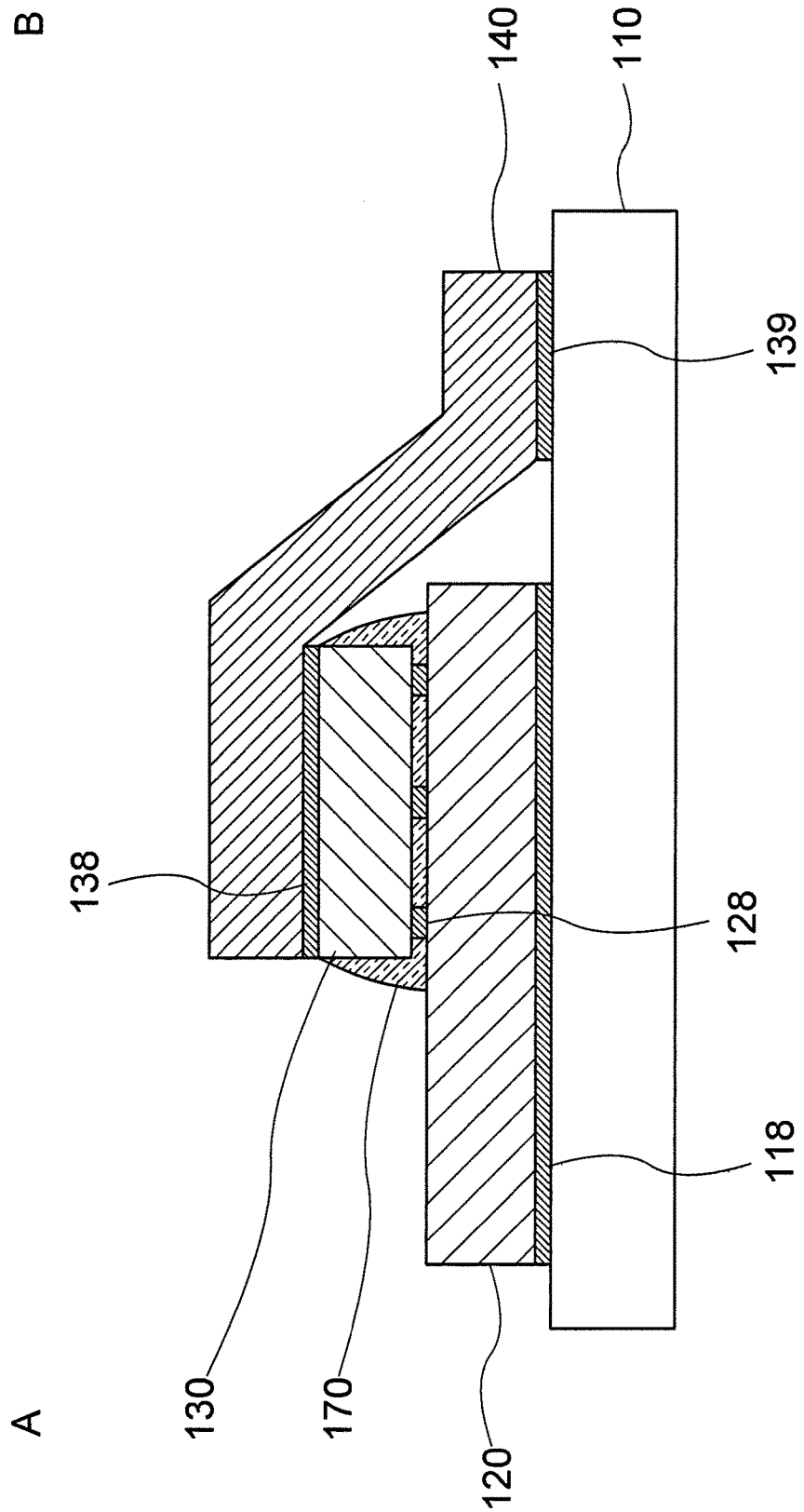
FIG. 9 is a cross-sectional view showing a step in the method for producing the semiconductor device in the modification of Embodiment 1 according to the present invention, specifically, a step of forming a metal clip that connects the power device and the lead frame to each other.

FIG. 9 is a cross-sectional view showing a step in the method for producing the semiconductor device 100 in the modification of Embodiment 1 according to the present invention, specifically, a step of forming the metal clip 140 that connects the power device 130 and the lead frame 110 to each other. In the step shown in FIG. 9, the highly heat conductive adhesive members 138 and 139 formed of solder are dripped onto the rear surface of the power device 130 and onto the lead frame 110 respectively. Before the solder is solidified, the heat releasing member 140 is mounted on the power device 130 and the lead frame 110.

Figure 10:
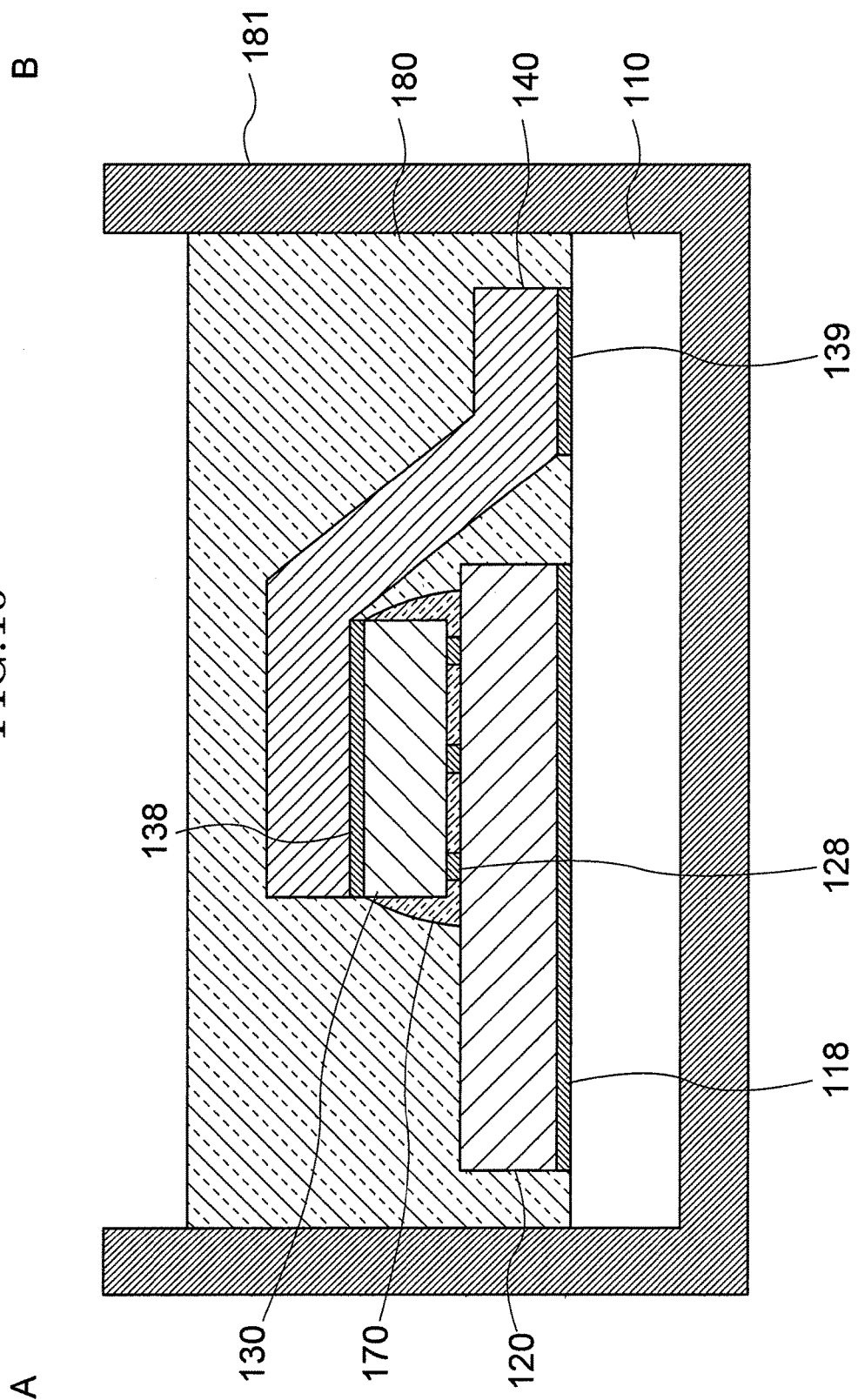
FIG. 10 is a cross-sectional view showing a step in the method for producing the semiconductor device in the modification of Embodiment 1 according to the present invention, specifically, a step of forming a second resin.

FIG. 10 is a cross-sectional view showing a step in the method for producing the semiconductor device 100 in the modification of Embodiment 1 according to the present invention, specifically, a step of forming the second resin 180. In the step shown in FIG. 10, the lead frame 110 having the circuit board 120, the power device 130 and the heat releasing member 140 formed thereon is placed in a molding die 181, and a resin material is injected into the molding die 181. Thus, the second resin 180 is formed. In the process shown in FIG. 10, the second resin 180 is formed by use of the molding die 181. The present invention is not limited to this process. According to an alternative method, the second resin 180 is formed by, for example, applying the resin material once or a plurality of times with no use of any molding die.

As described above, in the method for producing the semiconductor device 100 in the modification of Embodiment 1, the first resin 170 is formed between the circuit board 120 and the power device 130 before the heat releasing member 140 is formed. This suppresses the circuit board 120 and the power device 130 from being displaced from each other at the time of mounting the heat releasing member 140. Therefore, the process is more stable, and the semiconductor device 100 produced by this method has a high reliability without insufficient electric conductance due to an alignment error.

Embodiment 2

A semiconductor device 100 in Embodiment 2 according to the present invention will be described in detail with reference to FIG. 11 through FIG. 14. First, with reference to FIG. 11, a structure of the semiconductor device 100 in Embodiment 2 will be described. Then, with reference to FIG. 12 through FIG. 14, a method for producing the semiconductor device 100 in Embodiment 2 will be described. A plan view of the semiconductor device 100 in Embodiment 2 is substantially the same as that in FIG. 1, and thus FIG. 1 is used as a plan view of the semiconductor device 100 in Embodiment 2.

Figure 11:
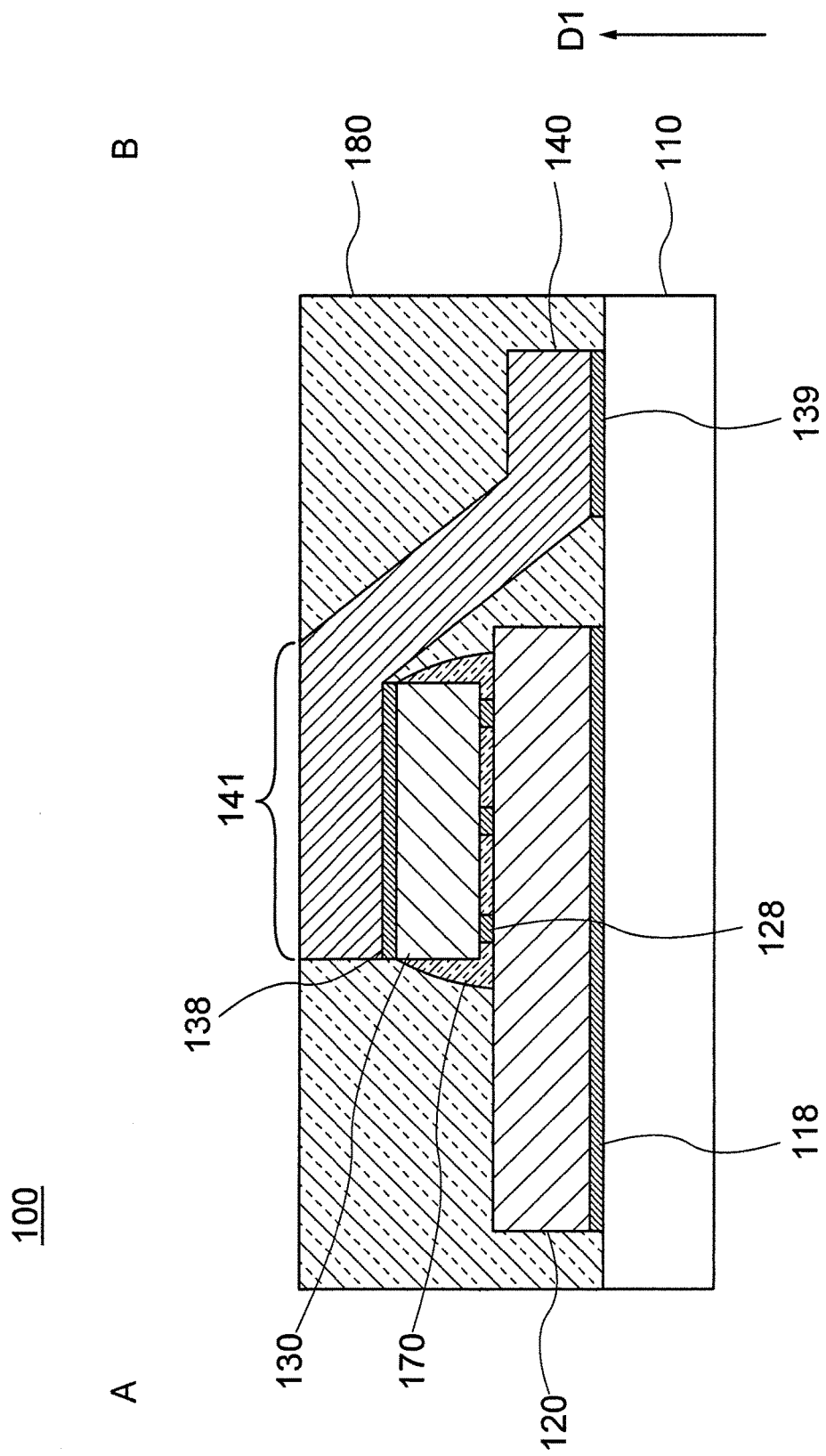
FIG. 11 is a cross-sectional view of a semiconductor device in Embodiment 2 according to the present invention, taken along line A-B in FIG. 1.

FIG. 11 is a cross-sectional view of the semiconductor device 100 in Embodiment 2 according to the present invention, taken along line A-B in FIG. 1. FIG. 11 is similar to FIG. 5, but is different from FIG. 5 in the following point. In FIG. 11, a surface 141 of a part of the heat releasing member 140 is exposed from the second resin 180. Namely, the second resin 180 covers the lead frame 110, the circuit board 120, the power device 130 and the heat releasing member 140 so as to expose a part of the heat releasing member 140. The surface 141 of the exposed part of the heat releasing member 140 may be flush with a surface of the second resin 180.

As described above, in the semiconductor device 100 in Embodiment 2, a part of the heat releasing member 140 is exposed. Therefore, heat generated in the power device 130 is released outside through the exposed part of the heat releasing member 140. Thus, a high heat releasing characteristic is provided by the power device 130, which has a high output. Specifically, in actual use of the semiconductor device 100 including the power device 130, a cooling mechanism is occasionally provided on a surface of the semiconductor device 100 directed in the direction of D1. In this case, the exposed part of the heat releasing member 140 is made closer to the cooling mechanism, and therefore, a higher heat releasing effect is provided than in the case where the heat releasing member 140 is not exposed. The surface 141 of the exposed part of the heat releasing member 140 and the surface of the second resin 180 are flush with each other. Therefore, in the case where the cooling mechanism is in contact with the surface of the semiconductor device 100 directed in the direction of D1, the cooling mechanism is suppressed from contacting the semiconductor device 100 unstably (loosely). Thus, the contact between the semiconductor device 100 and the cooling mechanism of an external device is stabilized.

Figure 12:
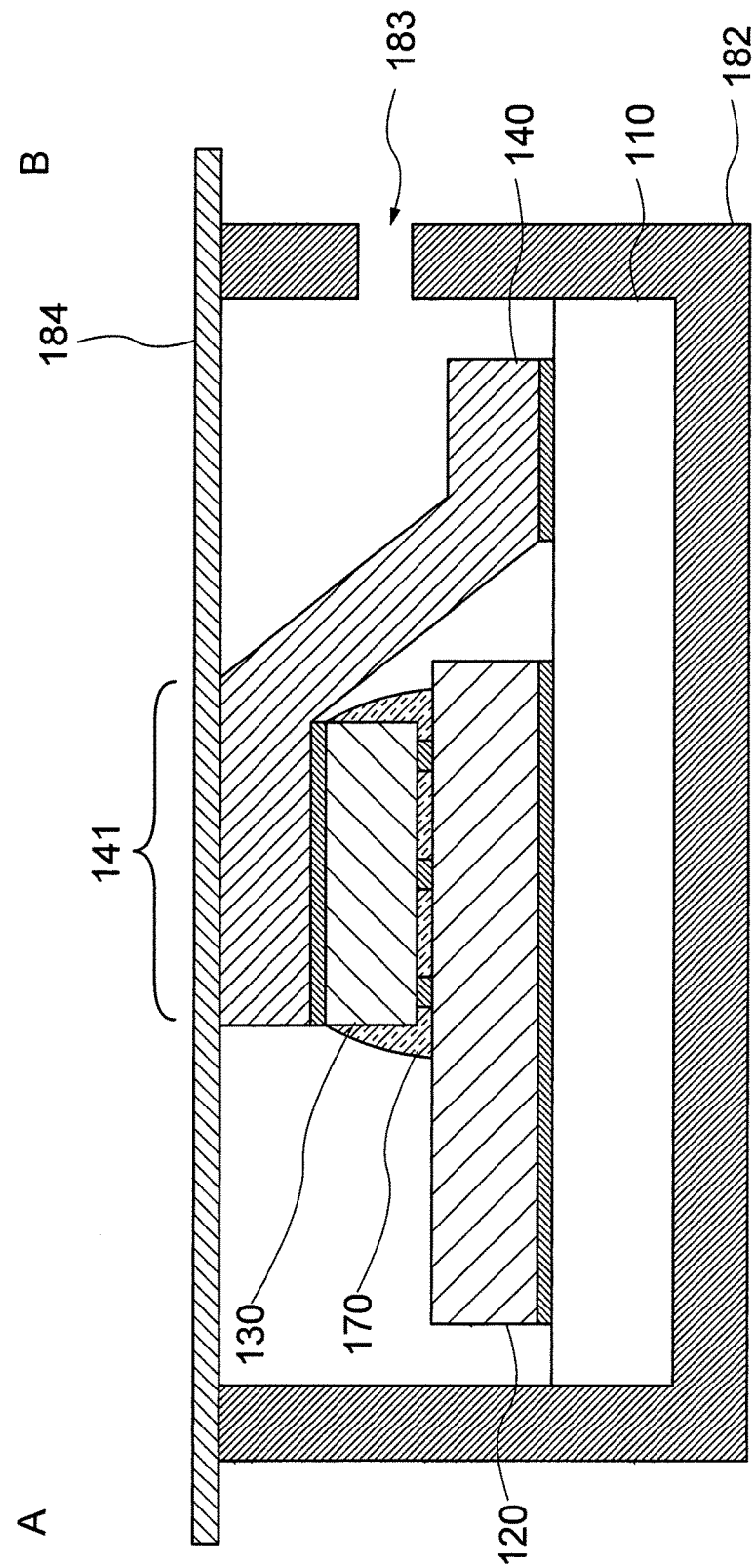
FIG. 12 is a cross-sectional view showing a step in a method for producing the semiconductor device in Embodiment 2 according to the present invention, specifically, a step of setting a molding die for a second resin and also setting a release film.

Now, a method for producing the semiconductor device 100 shown in FIG. 11 will be described with reference to cross-sectional views. FIG. 12 is a cross-sectional view showing a step in the method for producing the semiconductor device 100 in Embodiment 2 according to the present invention, specifically, a step of setting a molding die 182 for the second resin and also setting a release film 184. In the step shown in FIG. 12, the lead frame 110 having the circuit board 120, the power device 130 and the heat releasing member 140 mounted thereon is placed in the molding die 182 having an opening 183. On the molding die 182, the release film 184 is placed so as to contact the surface 141 of the exposed part of the heat releasing member 140. A surface of the release film 184 (surface to be in contact with the second resin 180) may be coated with an organic film in order to suppress the second resin 180 from being bonded with the release film 184. The organic film may be formed of a polytetrafluoroethylene resin, a silicone resin, a fluorine resin or the like.

Figure 13:
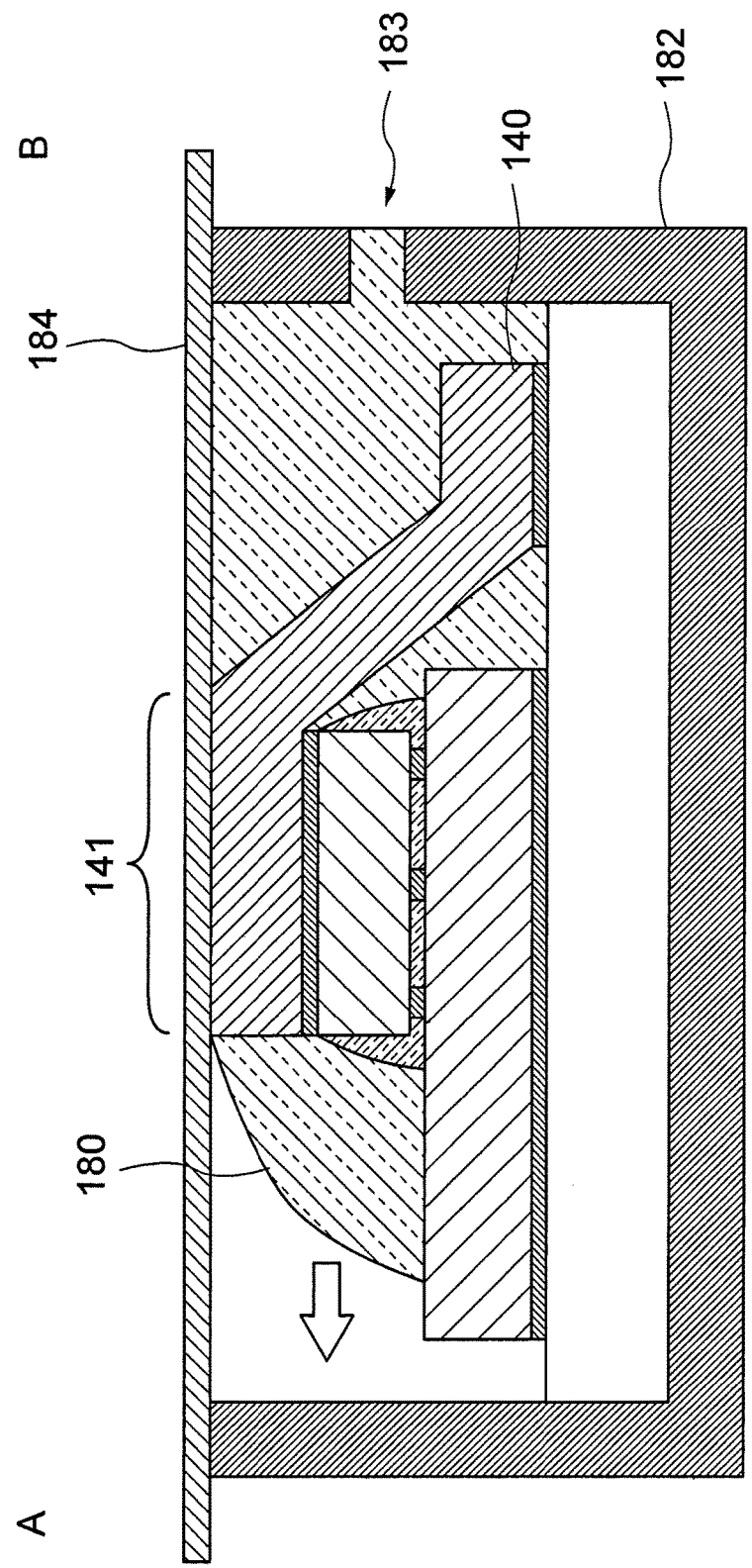
FIG. 13 is a cross-sectional view showing a step in the method for producing the semiconductor device in Embodiment 2 according to the present invention, specifically, a step of filling a space in the molding die with the second resin.

FIG. 13 is a cross-sectional view showing a step in the method for producing the semiconductor device 100 in Embodiment 2 according to the present invention, specifically, a step of filling a space in the molding die 182 with the second resin 180. In the step shown in FIG. 13, a resin material is injected into the molding resin 182 through the opening 183 to form the second resin 180. One or both of the molding die 182 and the release film 184 may have an ventilation opening so that air is not confined to generate air bubbles or the like in this step. The ventilation opening may be provided on the side opposite to the opening 183. The surface 141 of the exposed part of the heat releasing member 140 may be bonded with the release film 184 so that the second resin 180 is not formed on the surface 141 of the exposed part of the heat releasing member 140.

Figure 14:
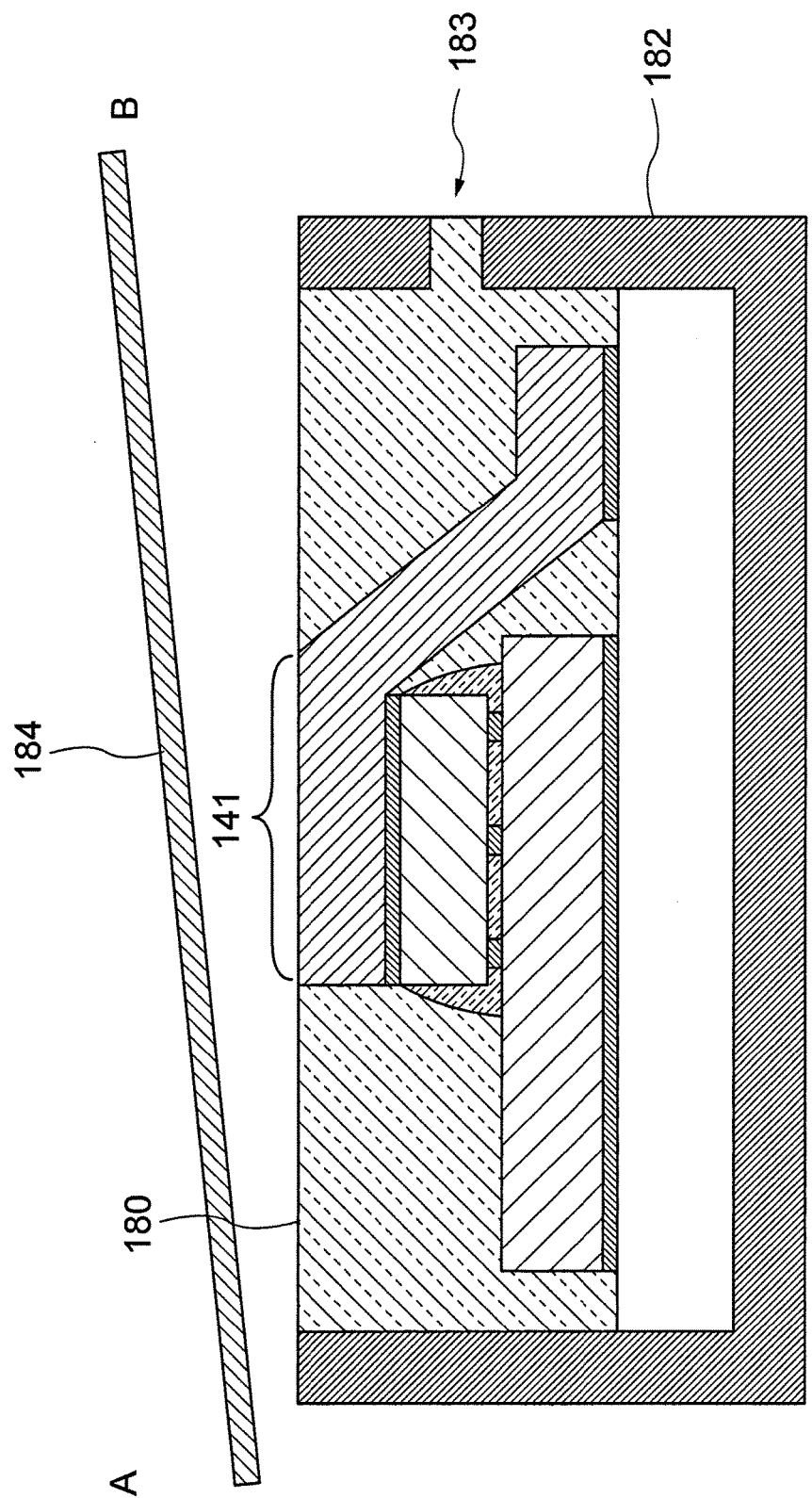
FIG. 14 is a cross-sectional view showing a step in the method for producing the semiconductor device in Embodiment 2 according to the present invention, specifically, a step of peeling off the release film.

FIG. 14 is a cross-sectional view showing a step in the method for producing the semiconductor device 100 in Embodiment 2 according to the present invention, specifically, a step of peeling off the release film 184. In the step shown in FIG. 14, the release film 184 is peeled off after the space in the molding die 182 is filled with the second resin 180. The release film 184 may be peeled off before or after the second resin 184 is cured. The release film 184 is easily peeled off because of the organic film coating the surface of the release film 184.

In the step shown in FIG. 14, the release film 184 is peeled off, and then the semiconductor device 100 is removed from the molding die 182. Thus, the semiconductor device 100 shown in FIG. 11 is obtained.

There may be a case where the second resin 180 is formed also on the surface 141 of the exposed part of the heat releasing member 140. In order to allow the surface 141 of the exposed part of the heat releasing member 140 to be exposed from the second resin 180 with certainty, the method for producing the semiconductor device 100 may further include a step of exposing the surface 141 of the exposed part of the heat releasing member 140 after the second resin 180 is formed. For example, the thickness of the second resin 180 may be decreased by dry etching, $O_2$ plasma treatment or the like. Alternatively, both of the second resin 180 and the heat releasing member 140 may be polished by mechanical polishing, chemical mechanical polishing (CMP) or the like.

As described above, in the method for producing the semiconductor device 100 in Embodiment 2, the second resin 180 is formed by use of the molding die 182 and the release film 184. In this manner, the second resin 180 exposing a part of the heat releasing member 140 is easily formed. Therefore, the semiconductor device 100 shown in FIG. 11 is produced at low cost by a relatively simple process.

Embodiment 3

Figure 15:
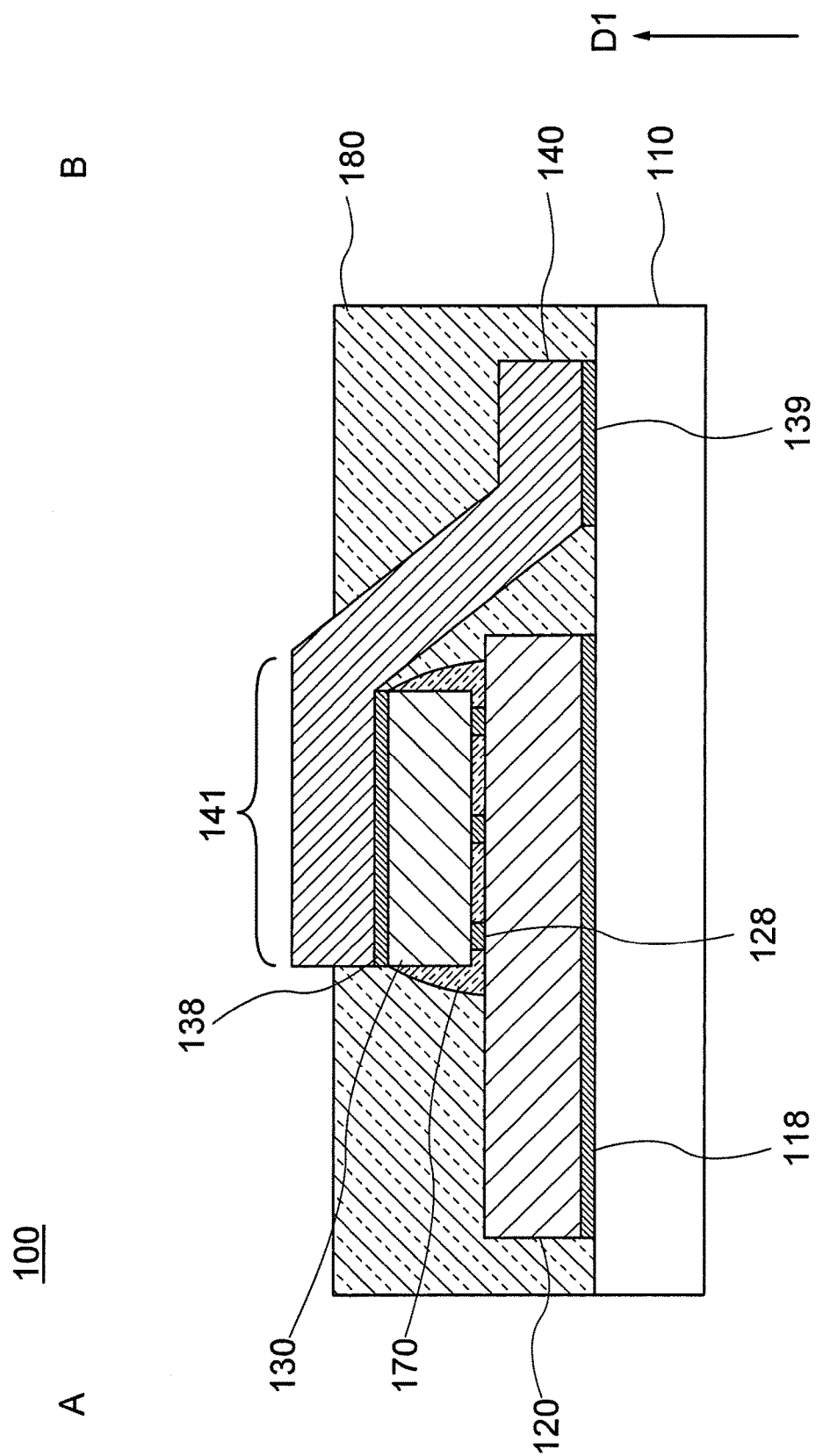
FIG. 15 is a cross-sectional view of a semiconductor device in Embodiment 3 according to the present invention, taken along line A-B in FIG. 1.

An overview of a semiconductor device 100 in Embodiment 3 according to the present invention will be described in detail with reference to FIG. 15. A plan view of the semiconductor device 100 in Embodiment 3 is substantially the same as that in FIG. 1, and thus FIG. 1 is used as a plan view of the semiconductor device 100 in Embodiment 3. FIG. 15 is a cross-sectional view of the semiconductor device 100 in Embodiment 3 according to the present invention, taken along line A-B in FIG. 1. FIG. 15 is similar to FIG. 11, but is different from FIG. 11 in the following point. In FIG. 15, an exposed part of the heat releasing member 140 protrudes from the second resin 180. Namely, the second resin 180 covers the lead frame 110, the circuit board 120, the power device 130 and the heat releasing member 140 such that a part of the heat releasing member 140 protrudes from the second resin 180; and a top surface and a side surface of the part of the heat releasing member 140 are exposed.

In FIG. 15, it is preferable that the protruding part of the heat releasing member 140 has a thickness that is at least ¼ of the total thickness of the heat releasing member 140. More preferably, the protruding part of the heat releasing member 140 has a thickness that is at least ½ of the total thickness of the heat releasing member 140.

The semiconductor device 100 shown in FIG. 15 is obtained by selectively removing a part of the second resin 180 from the semiconductor device 100 shown in FIG. 11. The second resin 180 may be partially removed by, for example, dry etching, by which the difference between the etching rate of the heat releasing member 140 and that of the second resin 180 is large, or by plasma treatment.

As described above, in the semiconductor device 100 in Embodiment 3, a part of the heat releasing member 140 is exposed. Therefore, heat generated in the power device 130 is released outside through the exposed part of the heat releasing member 140. Since an area size of the surface of the exposed part of the heat releasing member 140 is larger, a higher heat releasing characteristic is provided. In addition, the exposed part of the heat releasing member 140 protrudes. When the semiconductor device 100 in Embodiment 3 is water-cooled or air-cooled, convection of water or air is easily caused in the vicinity of the protruding part because of this structure. This provides a higher cooling effect than in the case where the exposed part of the heat releasing member 140 does not protrude.

(Modifications of Embodiment 3)

Figure 16:
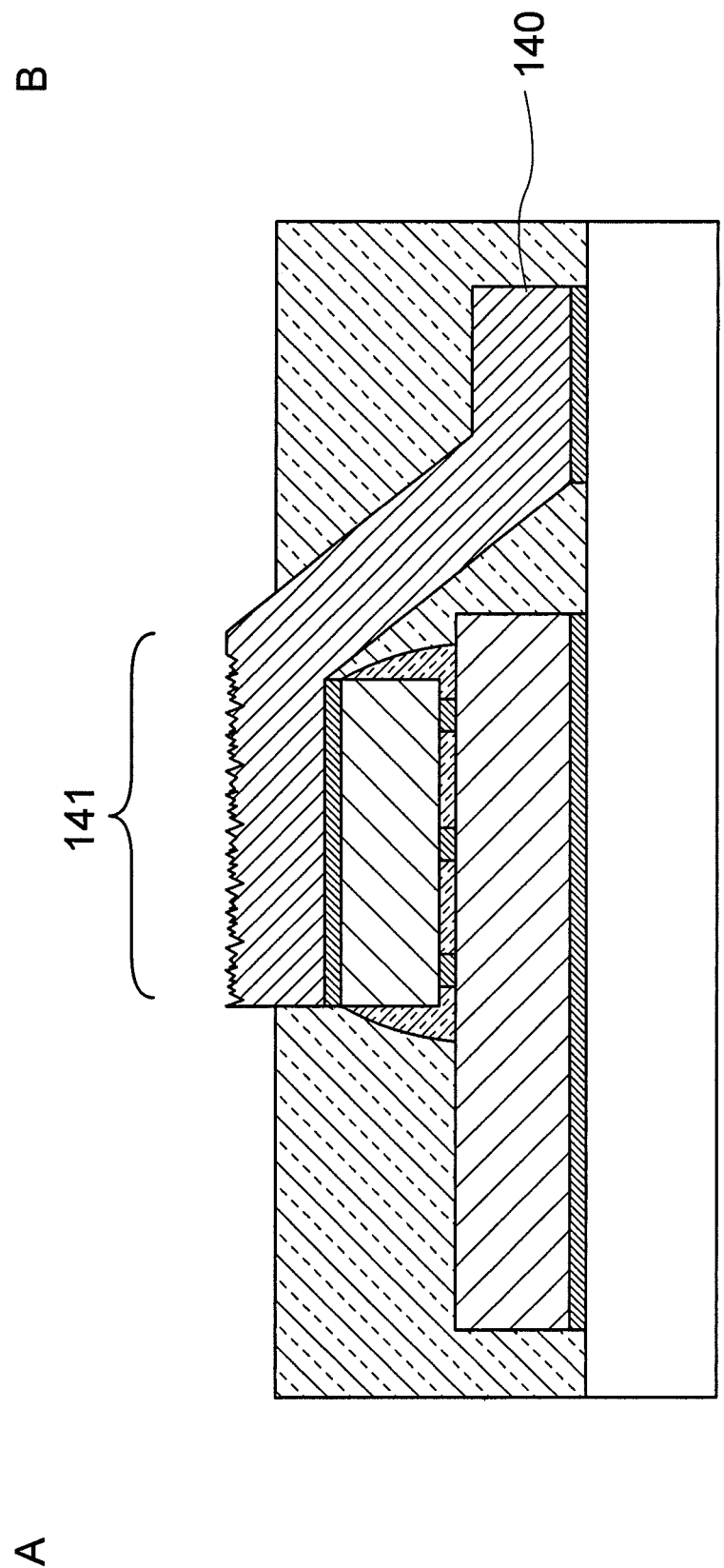
FIG. 16 is a cross-sectional view of a semiconductor device in modification 1 of Embodiment 3 according to the present invention, taken along line A-B in FIG. 1.
Figure 17:
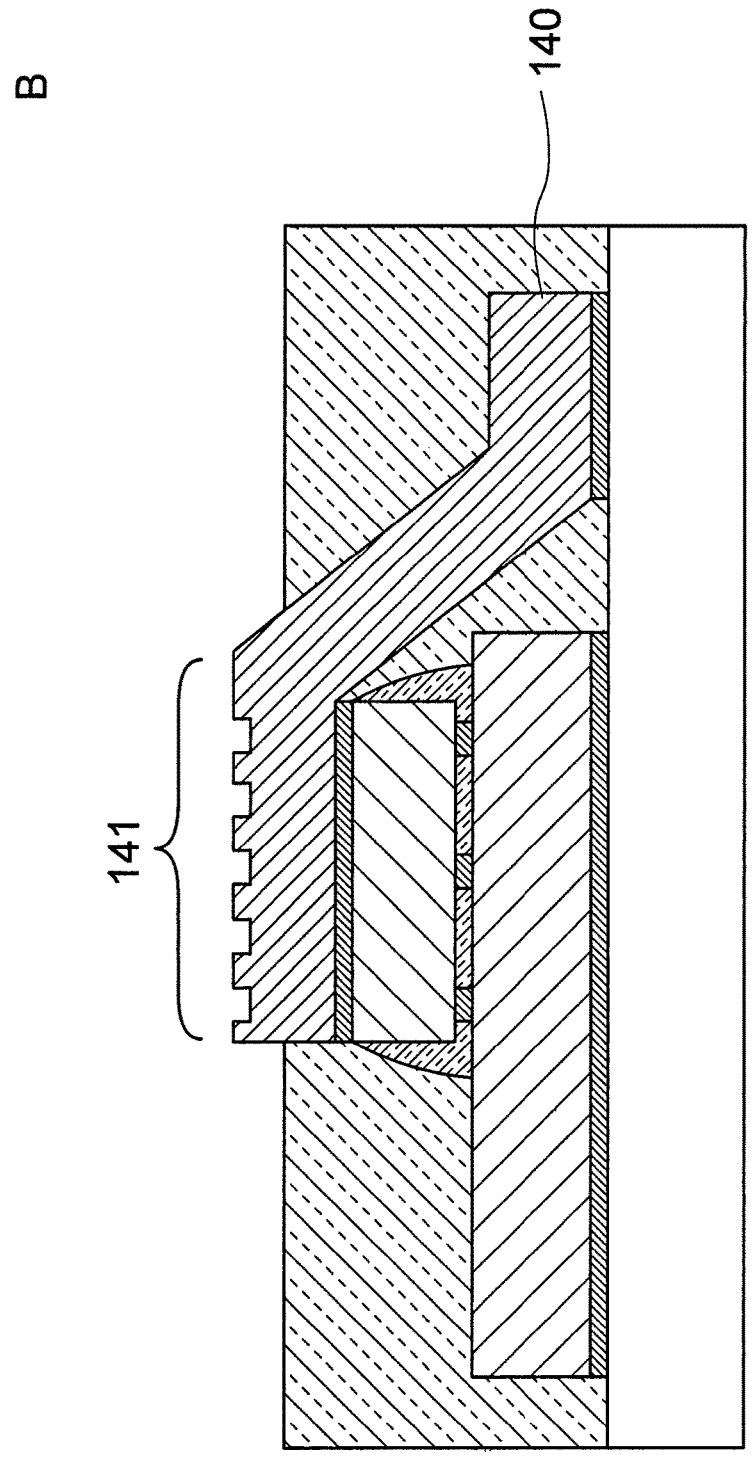
FIG. 17 is a cross-sectional view of a semiconductor device in modification 2 of Embodiment 3 according to the present invention, taken along line A-B in FIG. 1.
Figure 18:
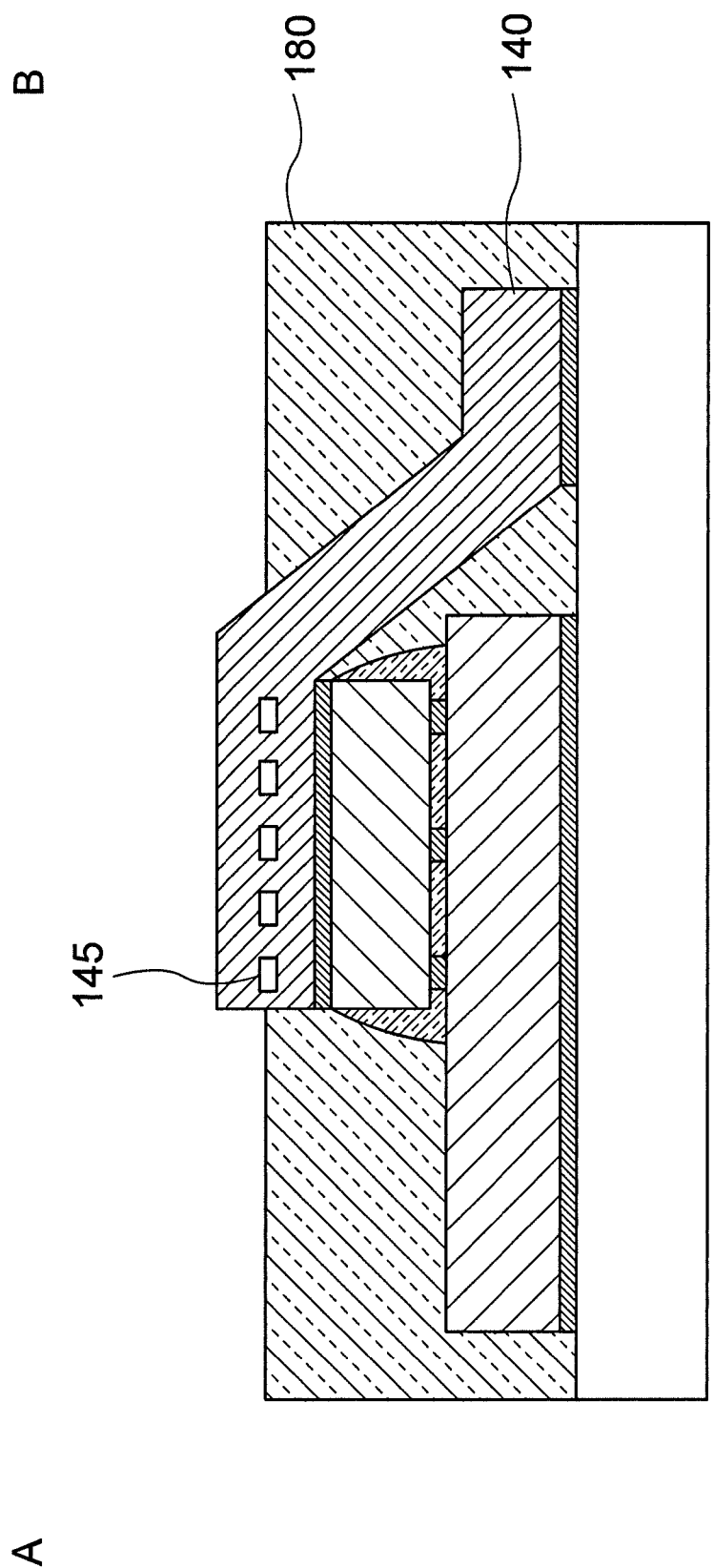
FIG. 18 is a cross-sectional view of a semiconductor device in modification 3 of Embodiment 3 according to the present invention, taken along line A-B in FIG. 1.
Figure 19:
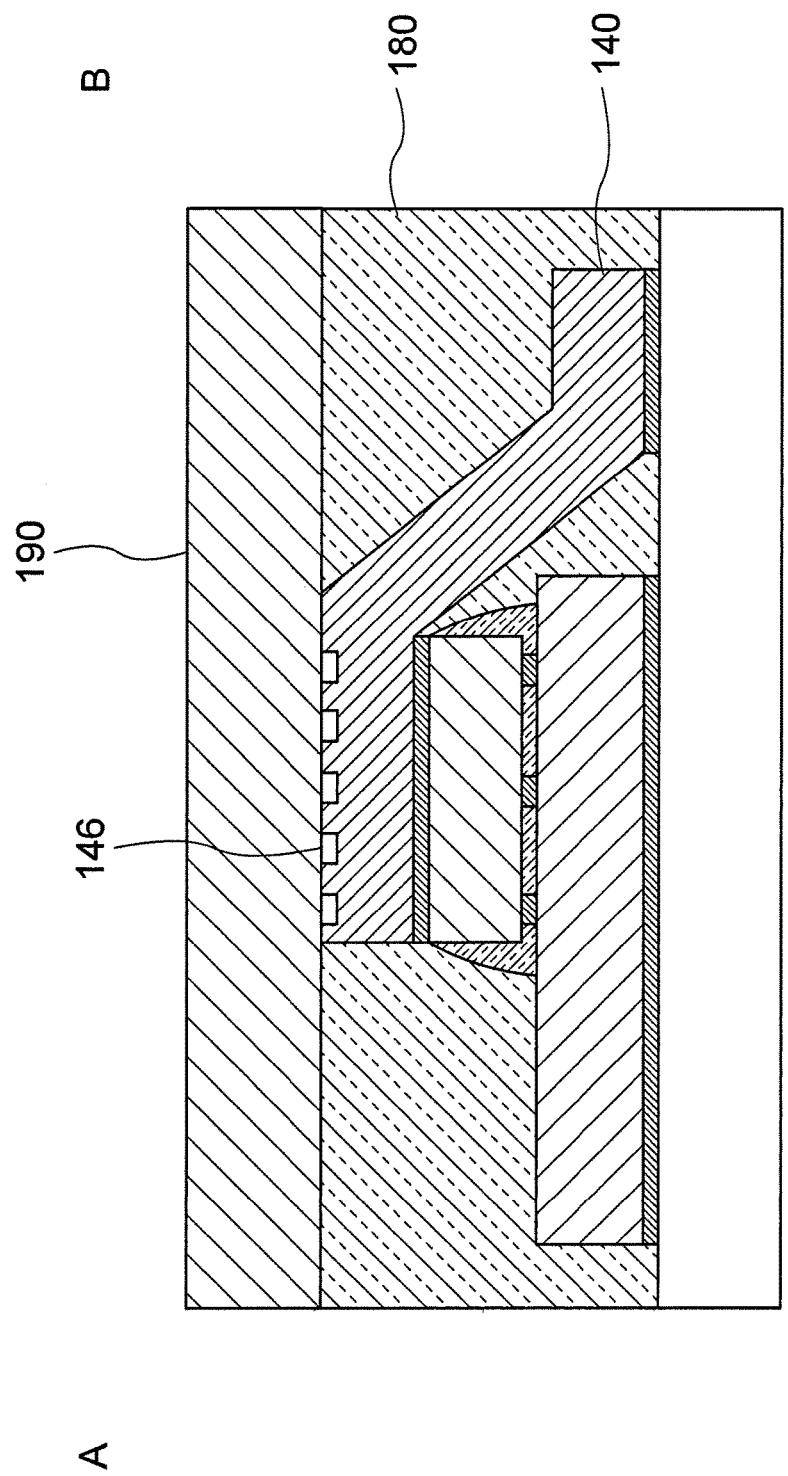
FIG. 19 is a cross-sectional view of a semiconductor device in modification 4 of Embodiment 3 according to the present invention, taken along line A-B in FIG. 1.

With reference to FIG. 16 through FIG. 19, overviews of semiconductor devices in modifications of Embodiment 3 will be described in detail. FIG. 1 is used as a plan view of the semiconductor device in each of the modifications 1, 2, 3 and 4 of Embodiment 3. FIG. 16 is a cross-sectional view of the semiconductor device in modification 1 of Embodiment 3 according to the present invention, taken along line A-B in FIG. 1. FIG. 17 is a cross-sectional view of the semiconductor device in modification 2 of Embodiment 3 according to the present invention, taken along line A-B in FIG. 1. FIG. 18 is a cross-sectional view of the semiconductor device in modification 3 of Embodiment 3 according to the present invention, taken along line A-B in FIG. 1. FIG. 19 is a cross-sectional view of the semiconductor device in modification 4 of Embodiment 3 according to the present invention, taken along line A-B in FIG. 1.

In modification 1 shown in FIG. 16, a surface 141 of the exposed part of the heat releasing member 140 is roughened (also referred to as "stain-finished"). The roughened surface of the heat releasing member 140 shown in FIG. 16 may be obtained by roughening the surface of the exposed part of the heat releasing member 140 in the semiconductor device 100 shown in FIG. 15 by a blasting method or a polishing method using a file. Alternatively, the heat releasing member 140 may be formed by use of a material having a surface that is entirely or partially rough. In modification 2 shown in FIG. 17, a surface 141 of the exposed part of the heat releasing member 140 has a pattern (also referred to as "microscopic shapes" or "texture"). The pattern may be obtained by processing the surface of the exposed part of the heat releasing member 140 in the semiconductor device 100 shown in FIG. 15 by a photolithography process or an etching process. Alternatively, the heat releasing member 140 may be formed by use of a material having a pattern.

The state of the surface 141 of the exposed part of the heat releasing member 140 shown in each of FIG. 16 and FIG. 17 may be referred to as a "convexed and concaved shape". Namely, the semiconductor device shown in each of FIG. 16 and FIG. 17 may be expressed as having a convexed and concaved shape at the surface 141 of the exposed part of the heat releasing member 140. As can be seen, in modifications 1 and 2 of Embodiment 3, an area size of the surface of the exposed part of the heat releasing member 140 is made larger, which provides a higher heat releasing characteristic.

In modification 3 shown in FIG. 18, a hollow flow path 145 is formed in the heat leasing member 140. Cooling water or cooling gas (the gas may be air) is caused to flow in the flow path 145, and thus the heat releasing member 140 is cooled efficiently. The flow path 145 may be formed in the heat releasing member 140 in advance, or may be formed by bonding the heat releasing member 140 shown in FIG. 17 and another heat releasing member.

In modification 4 shown in FIG. 19, the semiconductor device 100 in Embodiment 3 according to the present invention is attached to another device. A flow path 146 of a pattern having a convexed and concaved shape is formed at the surface of the heat releasing member 140. In FIG. 19, the flow path 146 is formed in an area enclosed by the heat releasing member 140 and a component 190 of the another device. In the case of modification 4 shown in FIG. 19, the surface of the exposed part of the heat releasing member 140 and the surface of the second resin 180 may be flush with each other.

In the semiconductor device shown in each of FIG. 18 and FIG. 19, the flow path formed in the heat releasing member 140 allows cooling water or cooling gas to flow therein, and thus actively cools the heat releasing member 140. Therefore, a higher heat releasing characteristic is provided.

Embodiment 4

Figure 20:
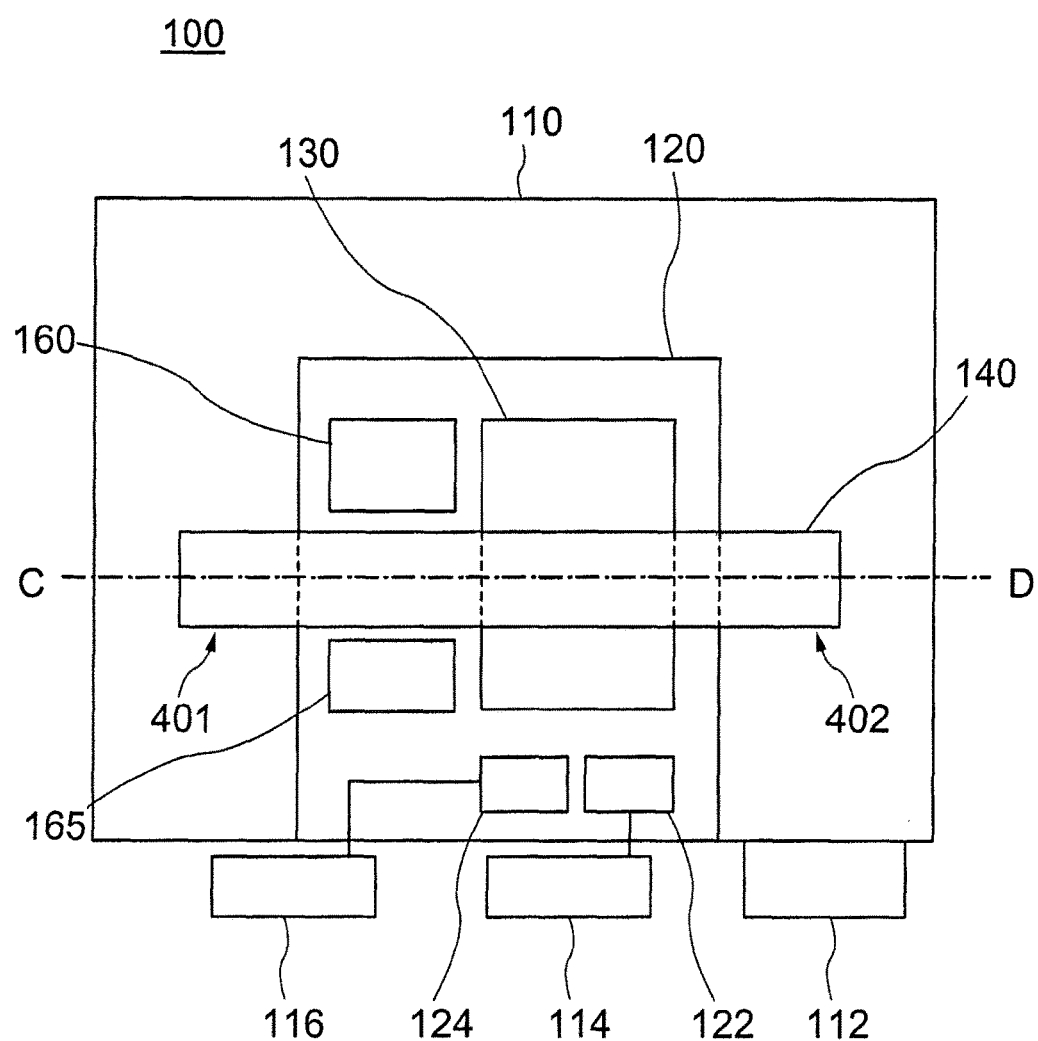
FIG. 20 is a schematic plan view of a semiconductor device in Embodiment 4 according to the present invention.
Figure 21:
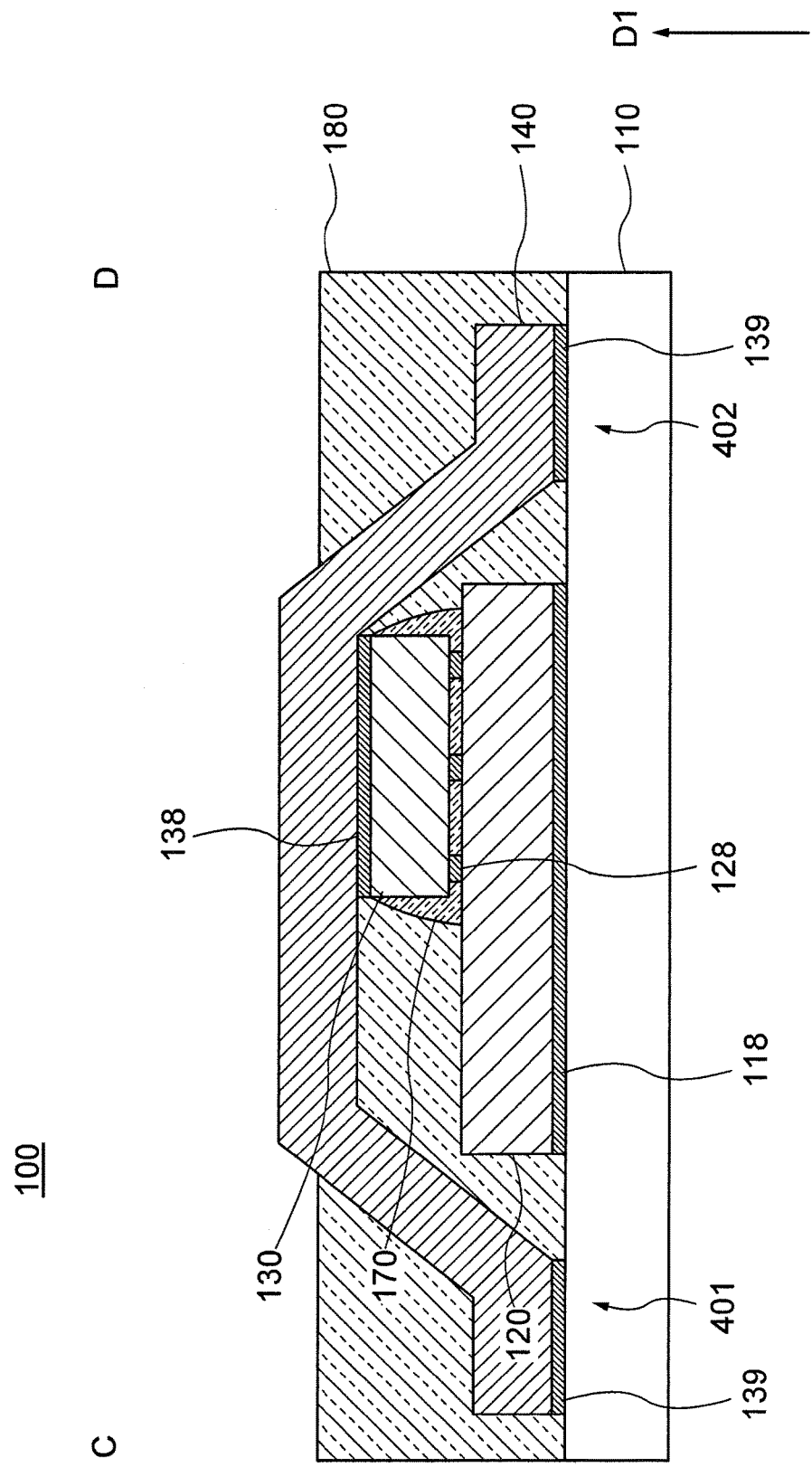
FIG. 21 is a cross-sectional view of the semiconductor device in Embodiment 4 according to the present invention, taken along line C-D in FIG. 20.

An overview of a semiconductor device 100 in Embodiment 4 according to the present invention will be described in detail with reference to FIG. 20 and FIG. 21. FIG. 20 is a schematic plan view of the semiconductor device 100 in Embodiment 4 according to the present invention. FIG. 21 is a cross-sectional view of the semiconductor device 100 in Embodiment 4 according to the present invention, taken along line C-D in FIG. 20.

FIG. 20 is similar to FIG. 1, but is different from FIG. 1 in the following point. In FIG. 20, the heat releasing member 140 extends in two different directions from the power device 130, and parts of the heat releasing member 140 extending in the two different directions are connected to the lead frame 110, respectively at a first connection point 401 and a second connection point 402. As can be seen from the cross-sectional shape of the semiconductor device 100 shown in FIG. 21, the heat releasing member 140 connected to the rear surface of the power device 130 is connected to the lead frame 110 at the first connection point 401 and the second connection point 402.

As can be seen, in the semiconductor device 100 in Embodiment 4, heat generated in the power device 130 is transmitted to the lead frame 110 via the heat releasing member 140 from the first connection point 401 and the second connection point 402. Therefore, a higher heat releasing characteristic is provided.

(Modification 1 of Embodiment 4)

Figure 22:
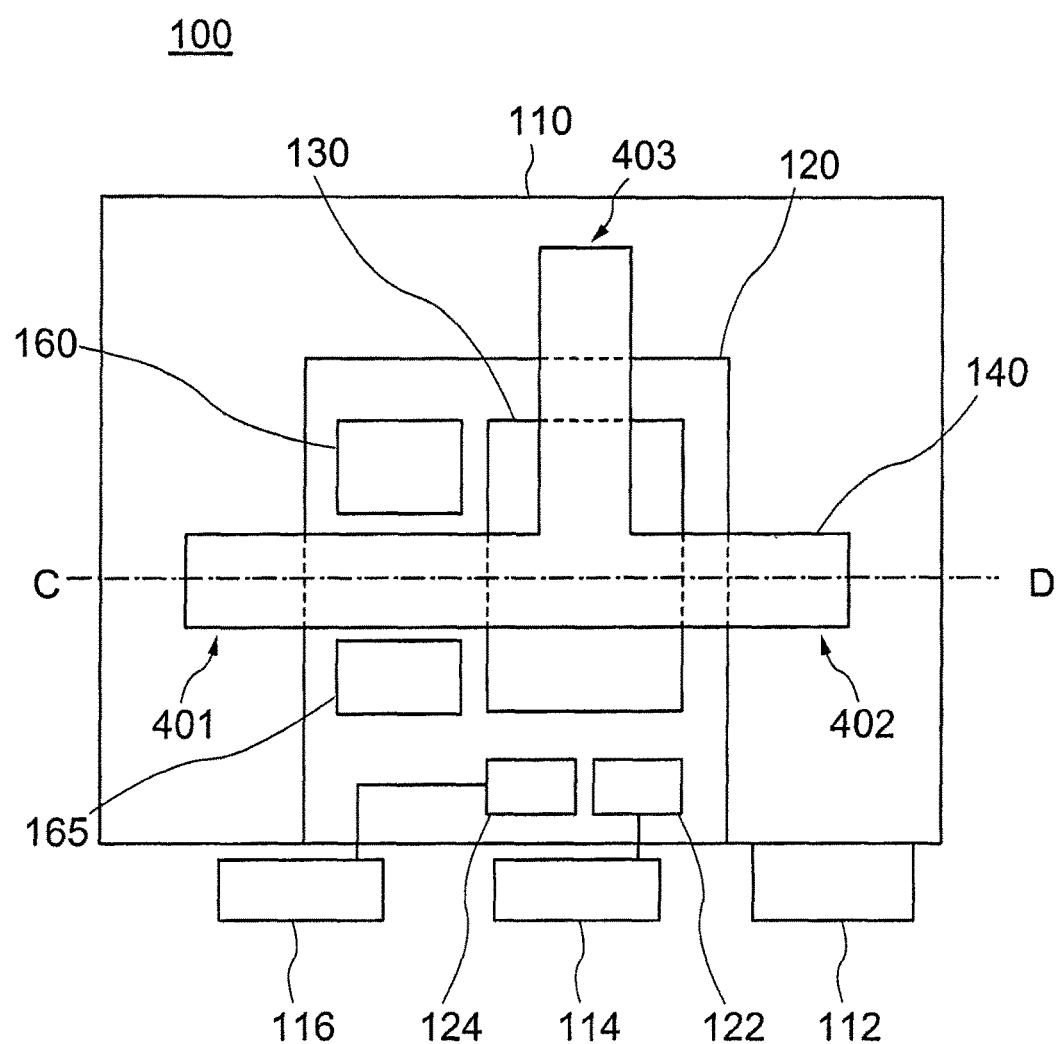
FIG. 22 is a schematic plan view of a semiconductor device in modification 1 of Embodiment 4 according to the present invention.

With reference to FIG. 22, an overview of a semiconductor device 100 in modification 1 of Embodiment 4 according to the present invention will be described in detail. FIG. 22 is a schematic plan view of the semiconductor device 100 in modification 1 of Embodiment 4 according to the present invention.

FIG. 22 is similar to FIG. 20, but is different from FIG. 20 in the following point. In FIG. 22, the heat releasing member 140 extends in three different directions from the power device 130, and parts of the heat releasing member 140 extending in the three different directions are connected to the lead frame 110, respectively at a first connection point 401, a second connection point 402 and a third connection point 403.

As can be seen, in the semiconductor device 100 in modification 1 of Embodiment 4, heat generated in the power device 130 is transmitted to the lead frame 110 via the heat releasing member 140 from the first connection point 401, the second connection point 402 and the third connection point 403. Therefore, a higher heat releasing characteristic is provided.

(Modification 2 of Embodiment 4)

Figure 23:
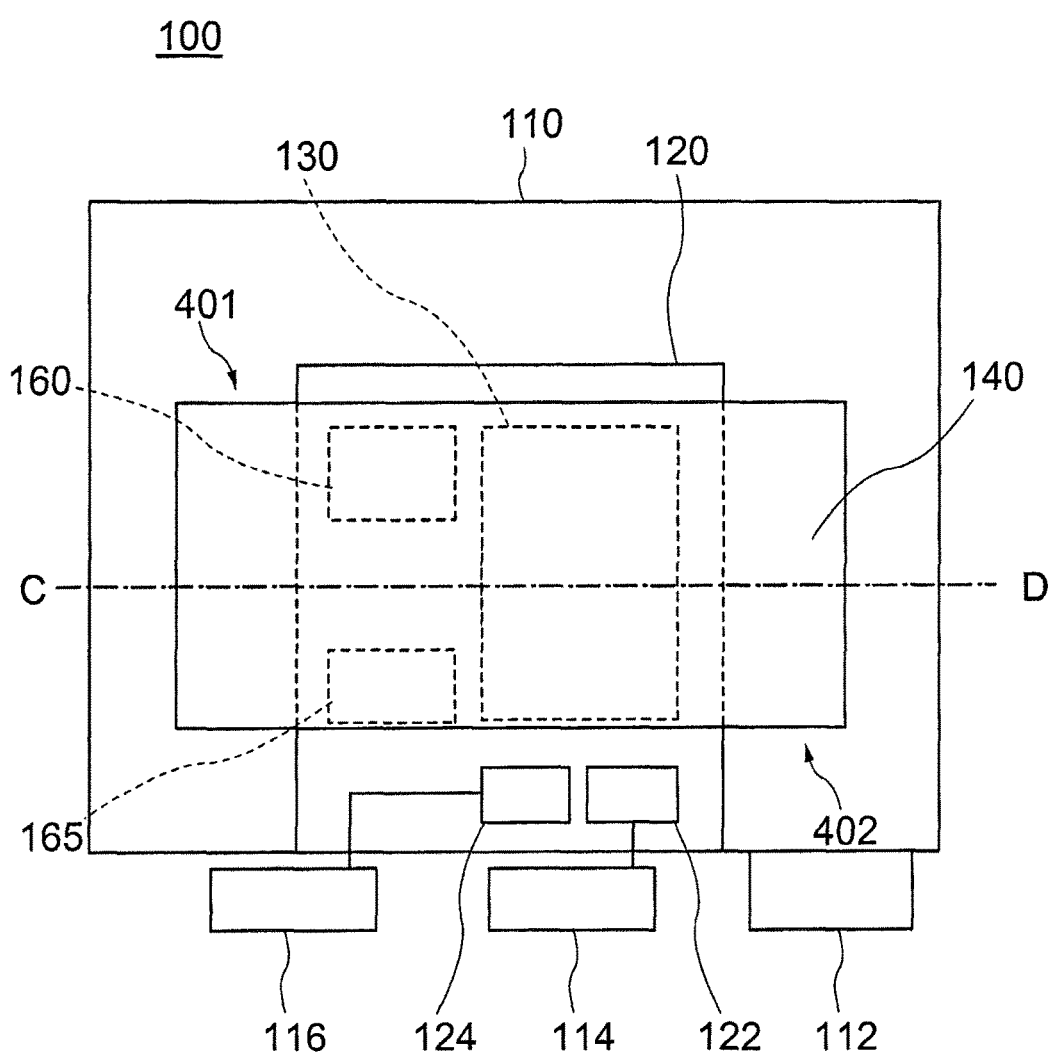
FIG. 23 is a schematic plan view of a semiconductor device in modification 2 of Embodiment 4 according to the present invention.

With reference to FIG. 23, an overview of a semiconductor device 100 in modification 2 of Embodiment 4 according to the present invention will be described in detail. FIG. 23 is a schematic plan view of the semiconductor device 100 in modification 2 of Embodiment 4 according to the present invention.

FIG. 23 is similar to FIG. 20, but is different from FIG. 20 in the following point. In FIG. 23, the heat releasing member 140 is formed so as to cover the power device 130, the IPD 160 and the peripheral IC 165. In the structure shown in FIG.

23, the heat releasing member 140 covers the entirety of all of the power device 130, the IPD 160 and the peripheral IC 165. The present invention is not limited to this structure. The present invention is applicable to a structure in which the heat releasing member 140 covers at least a part of a component having characteristics that are changed by the influence of electromagnetic waves.

As can be seen, in the semiconductor device 100 in modification 2 of Embodiment 4, heat generated in the power device 130 is transmitted to the lead frame 110 via the heat releasing member 140 from the first connection point 401 and the second connection point 402. Therefore, a higher heat releasing characteristic is provided. In addition, the heat releasing member 140 covers the power device 130, the IPD 160 and the peripheral IC 165, and therefore, suppresses the characteristics of the circuits of these components from being changed by the influence of external electromagnetic waves. Thus, the characteristics are stable and are not influenced by the environments.

Embodiment 5

Figure 24:
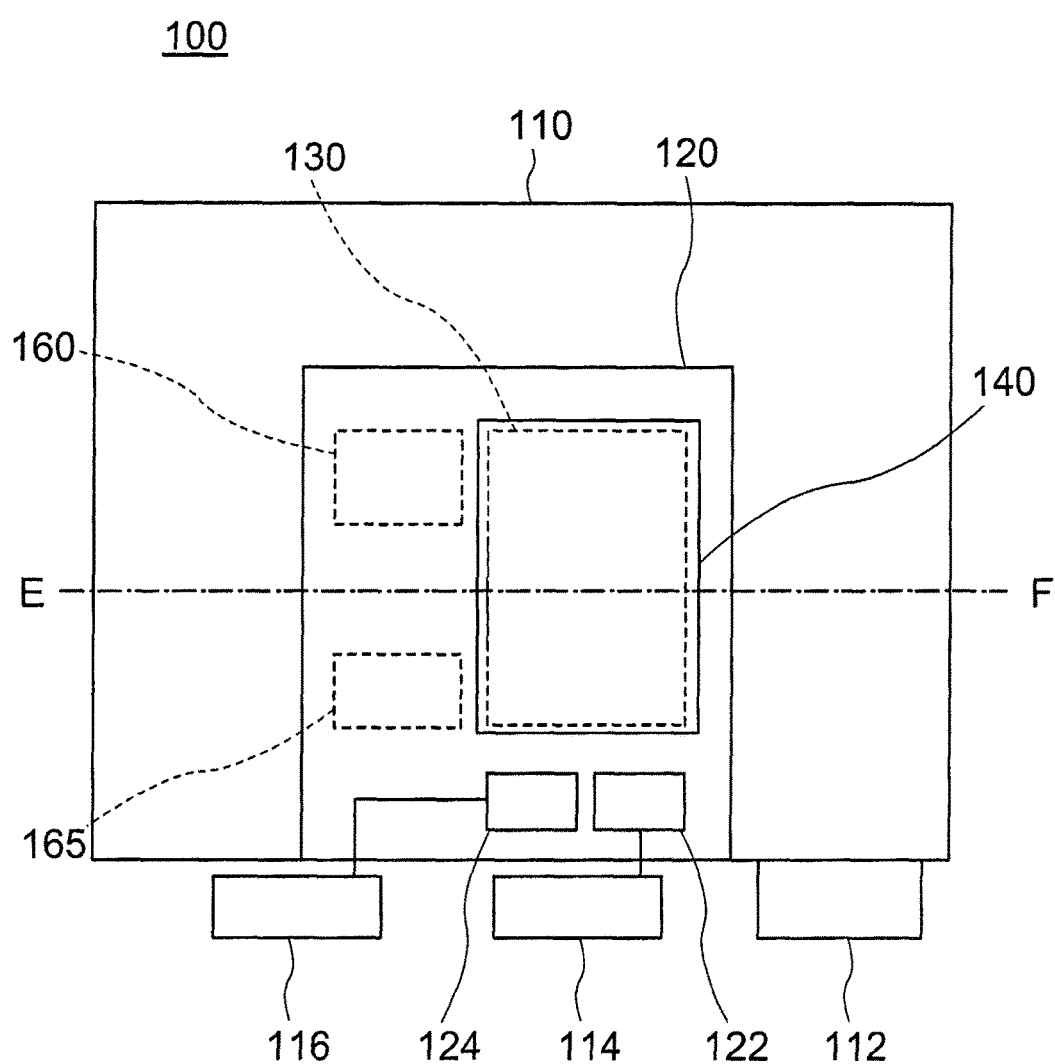
FIG. 24 is a schematic plan view of a semiconductor device in Embodiment 5 according to the present invention.
Figure 25:
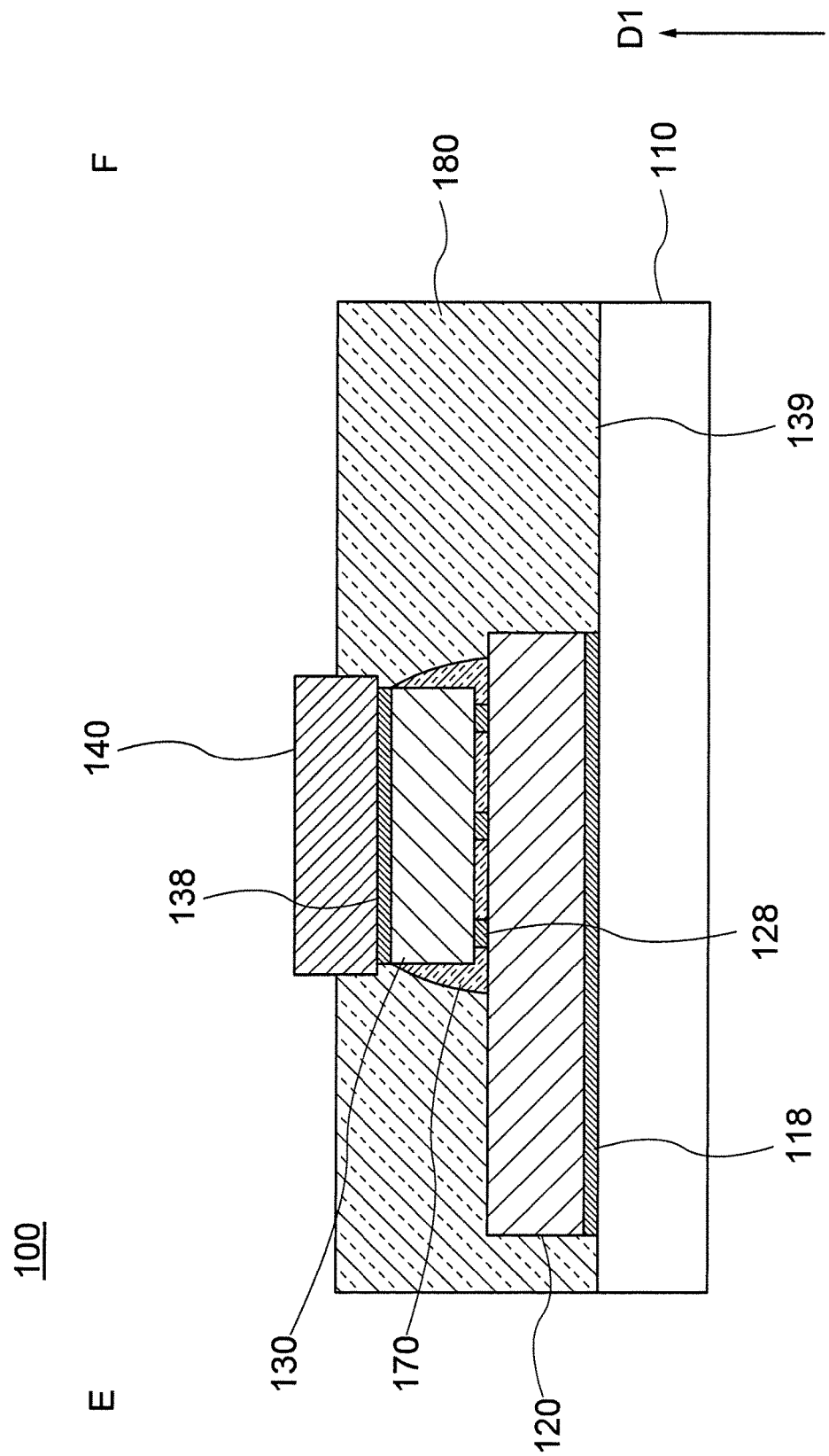
FIG. 25 is a cross-sectional view of the semiconductor device in Embodiment 5 according to the present invention, taken along line E-F in FIG. 24.

An overview of a semiconductor device 100 in Embodiment 5 according to the present invention will be described in detail with reference to FIG. 24 and FIG. 25. FIG. 24 is a schematic plan view of the semiconductor device 100 in Embodiment 5 according to the present invention. FIG. 25 is a cross-sectional view of the semiconductor device 100 in Embodiment 5 according to the present invention, taken along line E-F in FIG. 24.

FIG. 24 is similar to FIG. 1, but is different from FIG. 1 in the following point. In FIG. 24, the heat releasing member 140 is located only on the power device 130 and is not connected to the lead frame 110. In the structure shown in FIG. 24 and FIG. 25, the heat releasing member 140 is located so as to cover the entirety of the power device 130. The present invention is not limited to this structure. Alternatively, the heat releasing member 140 may cover only a part of the power device 130. Namely, in FIG. 24, there may be an area of the power device 130 that is not covered with the heat releasing member 140. Still alternatively, as shown in FIG. 23, the heat releasing member 140 may be located to so as to cover the IPD 160 and the peripheral IC 165.

As can be seen, in the semiconductor device 100 in Embodiment 5, a high heat releasing characteristic is provided with a smaller heat releasing member. This decreases the amount of material used for the heat releasing member, and thus provides the effect of cost reduction.

The present invention is not limited to the above-described embodiments, and the embodiments may be optionally altered without departing from the gist of the present invention.

What is claimed is:

1. A semiconductor device, comprising:
    a lead frame;
    a circuit board located on the lead frame;
    a power device including a switching element, the power device being mounted on the circuit board via a bump located between the power device and the circuit board;
    a heat releasing member adhered to the power device by an insulating adhesive material so that the heat releasing member is electrically isolated from the power device, the heat releasing member having a first surface and a second surface opposite to the first surface, the second surface including a top surface and a side surface; and
    a sealing resin covering the lead frame, the circuit board, the power device and the heat releasing member so as to expose the top surface and a top portion of the side surface,
    wherein
    the heat releasing member is connected to the lead frame by the first surface,
    the top surface comprises convex and concave shapes,
    the heat releasing member is a single-piece member that is continuous from a top of the convex and concave shapes to a first portion where the heat releasing member connects to the power device and is continuous from the top of the convex and concave shapes to a second portion where the heat releasing member connects to the lead frame, and
    the convex and concave shapes have randomness.

2. The semiconductor device according to claim 1, wherein the circuit board includes a capacitor element, a resistor element, an inductor element, a diode element and a switching element.

3. The semiconductor device according to claim 1, wherein the circuit board includes a circuit outputting an output signal in response to an input signal, the output signal being different from the input signal.

4. The semiconductor device according to claim 1, wherein:
    the sealing resin includes a first resin and a second resin;
    the first resin is located between the circuit board and the power device; and
    the second resin is located so as to cover the first resin.

5. The semiconductor device according to claim 4, wherein the first resin has a coefficient of thermal expansion closer to the coefficient of thermal expansion of the bump than the coefficient of thermal expansion of the second resin.

6. The semiconductor device according to claim 4, wherein the first resin has a heat conductivity higher than the heat conductivity of the second resin.

7. The semiconductor device according to claim 1, wherein the top surface has a roughened shape comprising the convex and concave shapes.

8. The semiconductor device according to claim 1, wherein the top surface has a stain-finished shape comprising the convex and concave shapes.

9. The semiconductor device according to claim 1, wherein the top surface has a microscopic pattern comprising the convex and concave shapes.

10. The semiconductor device according to claim 1, wherein the top surface has a texture pattern comprising the convex and concave shapes.

11. The semiconductor device according to claim 1, wherein a bottom of the concave shape is located above a top surface of the sealing resin.

12. A semiconductor device, comprising:
    a lead frame;
    a circuit board located on the lead frame;
    a power device including a switching element, the power device being mounted on the circuit board via a bump located between the power device and the circuit board;
    a heat releasing member adhered to the power device by an insulating adhesive material so that the heat releasing member is electrically isolated from the power device; the heat releasing member having a first surface and a second surface opposite to the first surface, the second surface including a top surface and a side surface; and a sealing resin covering the lead frame, the circuit board, the power device and the heat releasing member so as to expose the top surface and a top portion of the side surface, wherein the heat releasing member is connected to the lead frame by the first surface, the heat releasing member is a single-piece member that is continuous from the top surface to a first portion where the heat releasing member connects to the power device and is continuous from the top to a second portion where the heat releasing member connects to the lead frame, and the exposed part of the heat releasing member includes a flow path.

13. The semiconductor device according to claim 12, wherein the flow path is formed in the heat releasing member.

* * * * *